US008653588B2

(12) United States Patent
Watanabe et al.

(10) Patent No.: US 8,653,588 B2
(45) Date of Patent: Feb. 18, 2014

(54) SEMICONDUCTOR DEVICE AND ELECTRIC POWER CONVERSION SYSTEM USING THE SAME

(75) Inventors: So Watanabe, Mito (JP); Masaki Shiraishi, Hitachinaka (JP); Hiroshi Suzuki, Hitachi (JP); Mutsuhiro Mori, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/553,431

(22) Filed: Jul. 19, 2012

(65) Prior Publication Data

US 2013/0020634 A1 Jan. 24, 2013

(30) Foreign Application Priority Data

Jul. 20, 2011 (JP) ................................ 2011-158595

(51) Int. Cl.
*H01L 29/66* (2006.01)
(52) U.S. Cl.
USPC .................................. 257/330; 257/E29.262
(58) Field of Classification Search
CPC ............ H01L 29/7813; H01L 28/4236; H01L 29/66734
USPC .................................. 257/328, 330, E29.262
See application file for complete search history.

(56) References Cited

U.S. PATENT DOCUMENTS

| | | | |
|---|---|---|---|
| 7,456,487 B2 | 11/2008 | Ogura et al. | |
| 2003/0160270 A1 | 8/2003 | Pfirsch et al. | |
| 2007/0108511 A1 | 5/2007 | Hirler | |
| 2007/0138547 A1 | 6/2007 | Nakamura | |
| 2007/0210356 A1 | 9/2007 | Henson | |
| 2008/0283867 A1* | 11/2008 | Mori et al. | ..................... 257/133 |
| 2011/0133718 A1 | 6/2011 | Watanabe et al. | |

FOREIGN PATENT DOCUMENTS

| | | |
|---|---|---|
| JP | 2000-307116 A | 11/2000 |
| JP | 2005-327806 A | 11/2005 |
| JP | 2005-340626 A | 12/2005 |
| JP | 2011-119416 A | 6/2011 |

OTHER PUBLICATIONS

European Search Report dated Nov. 21, 2012 (six (6) pages).

* cited by examiner

*Primary Examiner* — Nikolay Yushin
(74) *Attorney, Agent, or Firm* — Crowell & Moring LLP

(57) ABSTRACT

A semiconductor device includes: a first semiconductor layer of a first conductivity type; a second semiconductor layer of a second conductivity type on the first semiconductor layer; trenches in the first semiconductor layer; a semiconductor protruding part on the first semiconductor layer; a third semiconductor layer on the semiconductor protruding part; a fourth semiconductor layer on the third semiconductor layer; a gate insulating layer disposed along the trench; a first interlayer insulating layer disposed along the trench; a first conductive layer facing to the fourth semiconductor layer; a second conductive layer on the first interlayer insulating layer; a second interlayer insulating layer covering the second conductive layer; a third conductive layer on the third semiconductor layer and fourth semiconductor layer; a contacting part connecting the third conductive layer and third semiconductor layer; and a fourth conductive layer formed on the second semiconductor layer.

10 Claims, 28 Drawing Sheets

SEMICONDUCTOR DEVICE AND ELECTRIC POWER CONVERSION SYSTEM USING THE SAME

CROSS REFERENCE TO RELATED APPLICATIONS

This application claims the benefit of Japanese Patent Application No. 2011-158595 filed on Jul. 20, 2011, the disclosure of which is incorporated herein by reference.

BACKGROUND OF THE INVENTION

1. Field of the Invention

The present invention relates to a semiconductor device and an electric power conversion system using the semiconductor device. In particular the present invention relates to a semiconductor device which is suitable for an Insulated Gate Bipolar Transistor (hereinafter referred to as IGBT) having a trench insulated gate structure, and to an electric power conversion system using the semiconductor device.

2. Description of the Related Art

The IGBT is a switching element that controls electric current flowing between the collector electrode and the emitter electrode by a voltage applied to the gate electrode. A power controlled by the IGBT ranges from tens of watts to several hundred thousand watts. In addition, the switching frequency ranges from tens of Hertz to several hundred thousand Hertz. Due to these wide ranges, the IGBT is widely used in small electric appliances such as household air conditioners and electronic ovens, as well as in large electric appliances like inverters used in railroad and steel works.

For improving the efficiency of these electric appliances, reducing loss is a requirement to the IGBT. In other words, reducing conduction loss and switching loss is required to the IGBT. In addition, in order to prevent problems such as EMC noise and mal-function, electric breakdown of a motor etc., it is also required to be able to control dv/dt, the rate of change of output voltage, in accordance with a specification of an application.

A patent document JP 2000-307116 A (referred to as Patent Document 1 hereinafter) discloses a technique of producing an IGBT by arranging trench insulated gates at different intervals, forming a channel on a side where a trench distance is smaller, and forming a p-type well layer on a side where a trench distance is larger. This technique achieves an IGBT having input capacitance of the gate lowered, low switching loss, low on-state voltage and low saturation current, without decrease in a withstand voltage.

In addition, another patent document JP 2005-327806 A (referred to as Patent Document 2 hereinafter) discloses a technique for implementing an IGBT having a small gate-collector capacitance (GC capacitance), a large capacitor ratio between gate-emitter capacitance (GE capacitance) and the GC capacitance, a high switching speed, a low switching loss, and a high injection coefficient of on-state by employing a structure without a floating well.

However, in a conventional IGBT described in Patent Document 1, controllability of dv/dt of the output voltage of the IGBT when turned on, or dv/dt of the voltage of a diode (free-wheeling diodes) of arms may decrease when using the IGBT in an electric power conversion system.

In addition, forming a wide trench causes a high step portion, and the high step may cause difficulty in manufacturing and designs.

Further, when the production method described in Patent Document 2 is used, there may be a case where a crystal defect occurs due to epitaxial growth covering the insulating film, and the crystal defect causes a large leakage current. Still further, since the number of forming processes of the substrate is increased, the cost of the substrate may be increased.

SUMMARY OF THE INVENTION

An aspect of the present invention provides a semiconductor device of the present invention including: a first semiconductor layer of a first conductivity type; a second semiconductor layer of a second conductivity type formed on one of surfaces of the first semiconductor layer; a trench formed on the other surface of the first semiconductor layer opposite to the second semiconductor layer; a semiconductor protruding part whose side surfaces sandwiched between the trenches and formed on a rest of the surface of the first semiconductor layer other than the surface on which the trench is formed; a third semiconductor layer of the second conductivity type formed on a surface of the semiconductor protruding part; a fourth semiconductor layer of the first conductivity type formed on a surface of the third semiconductor layer and having a higher impurity concentration than the first semiconductor layer; agate insulating layer disposed on and along apart of an inner wall of the trench; a first interlayer insulating layer disposed on and along a rest of the inner wall of the trench other than the inner wall on which the gate insulating layer is disposed; a first conductive layer at least a part thereof facing to the fourth semiconductor layer via the gate insulating layer; a second conductive layer formed on a surface of the first interlayer insulating layer; a second interlayer insulating layer at least a part thereof covering at least a part of a surface of the second conductive layer; a third conductive layer at least a part thereof formed on surfaces of the third semiconductor layer and the fourth semiconductor layer and electrically connected to the fourth semiconductor layer; a contacting part electrically connecting the third conductive layer and the third semiconductor layer; and a fourth conductive layer formed on a surface of the second semiconductor layer, wherein a part of the surface of the semiconductor protruding part includes a part of the first semiconductor layer.

An aspect of the present invention provides an electric power conversion system including the above-mentioned semiconductor device.

The IGBT may have a low loss, a high breakdown voltage, a high controllability of rate dv/dt of output voltage, and a high productivity.

DETAILED DESCRIPTION OF THE EXEMPLARY EMBODIMENT

The present invention provides an IGBT having a low loss, a high breakdown voltage, a high controllability of dv/dt of output voltage, and a high productivity.

Embodiments of the present invention will be described next in detail with reference to the related drawings.

First Embodiment

IGBT1

The semiconductor device IGBT1 according to the first embodiment of the present invention will be explained with reference to FIGS. 1 to 4.

Figure 1:
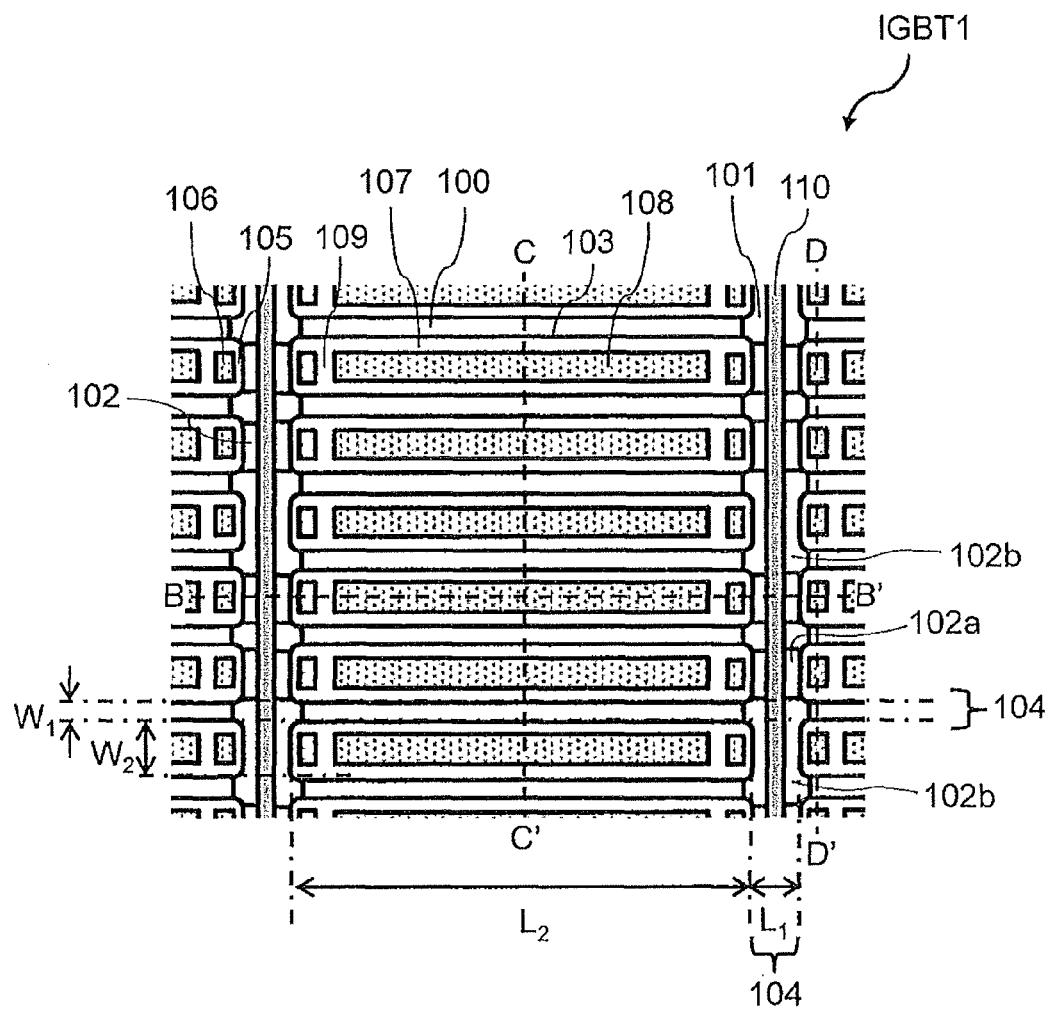
FIG. 1 is a sectional view, taken along plane A-A' in FIGS. 2 to 4, of a semiconductor device IGBT1 according to a first embodiment of the present invention.
Figure 2:
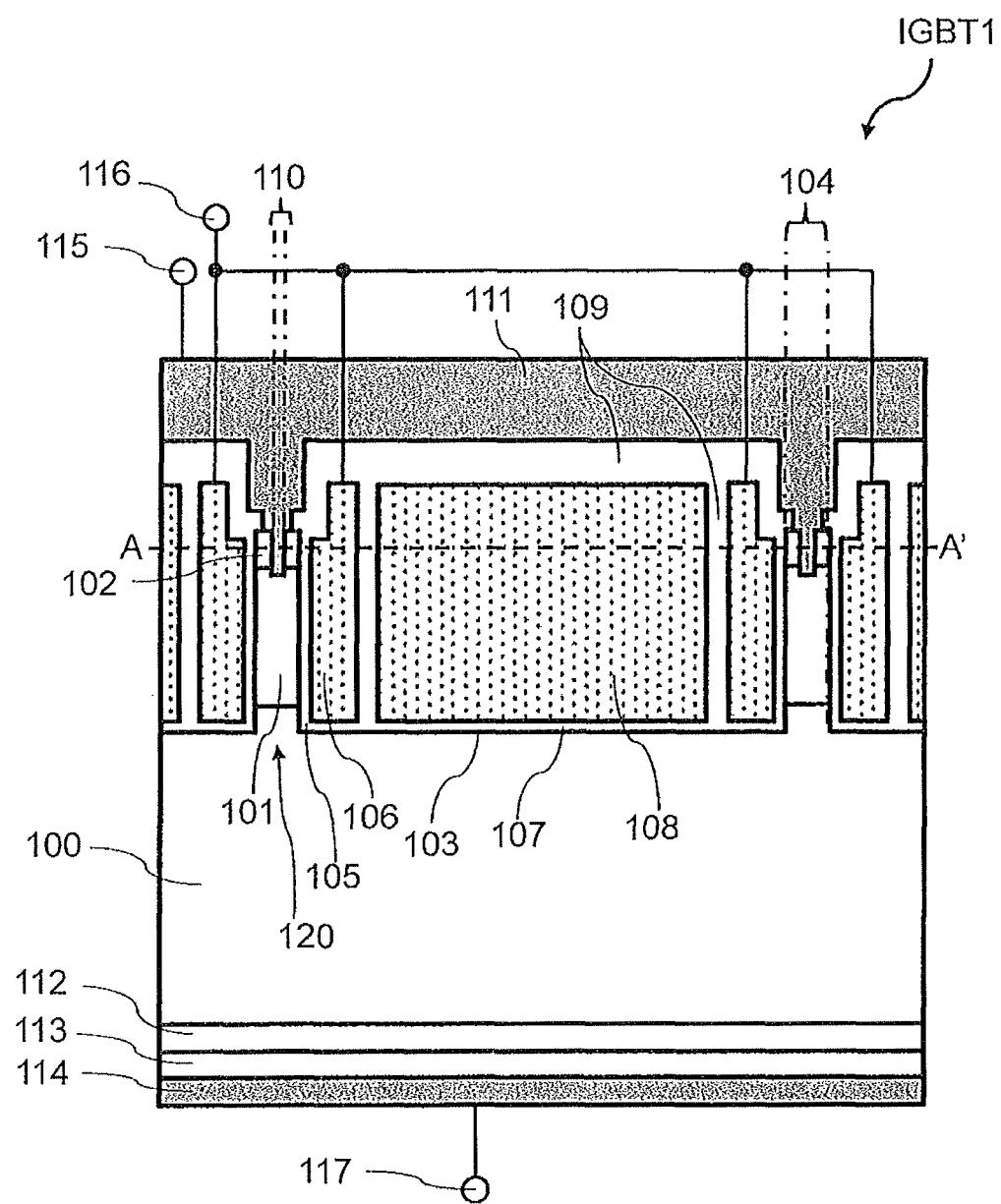
FIG. 2 is a sectional view, taken along plane B-B' in FIGS. 1, 9, 11 and 14, of the semiconductor device IGBT1 according to the first embodiment of the present invention.
Figure 3:
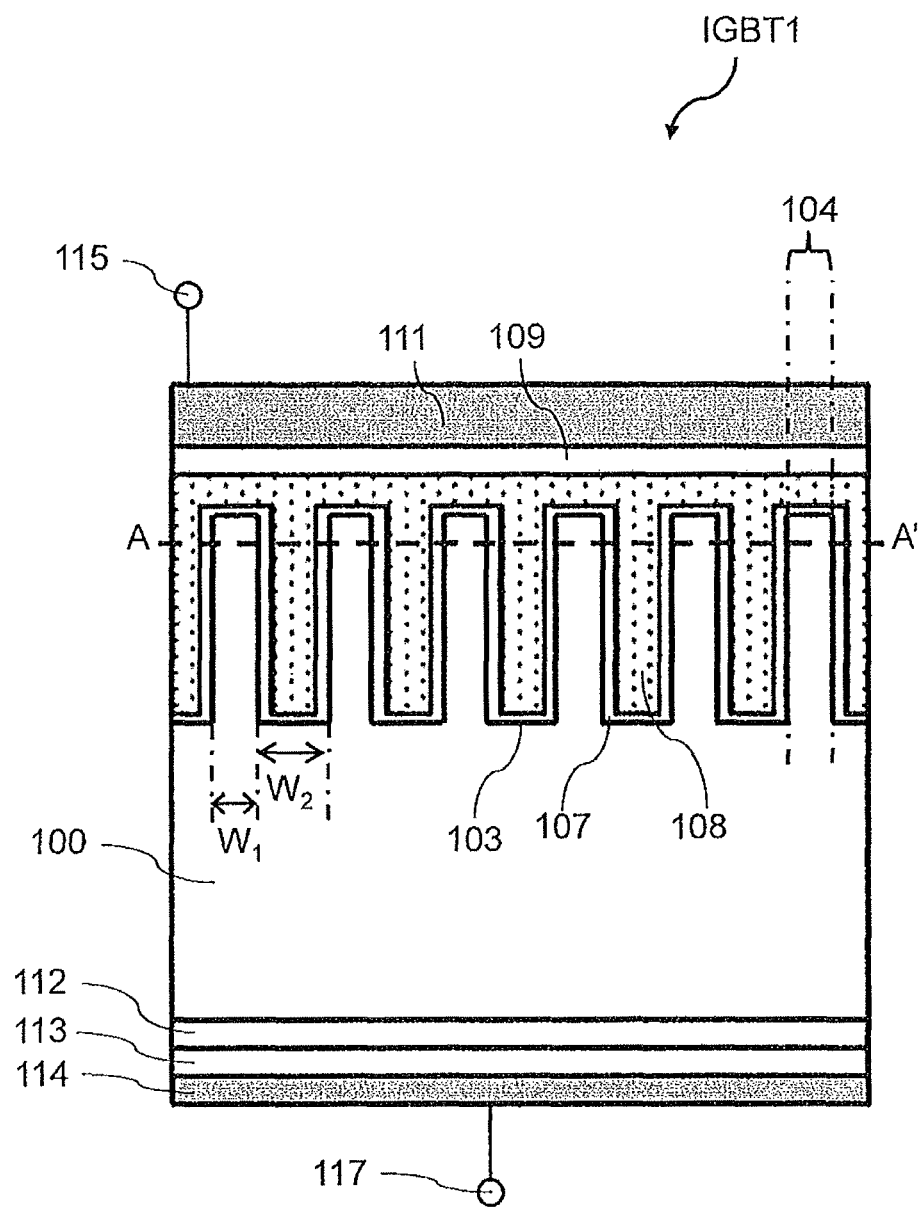
FIG. 3 is a sectional view, taken along plane C-C' in FIGS. 1, 9 and 14 of the semiconductor device IGBT1 according to the first embodiment of the present invention.
Figure 4:
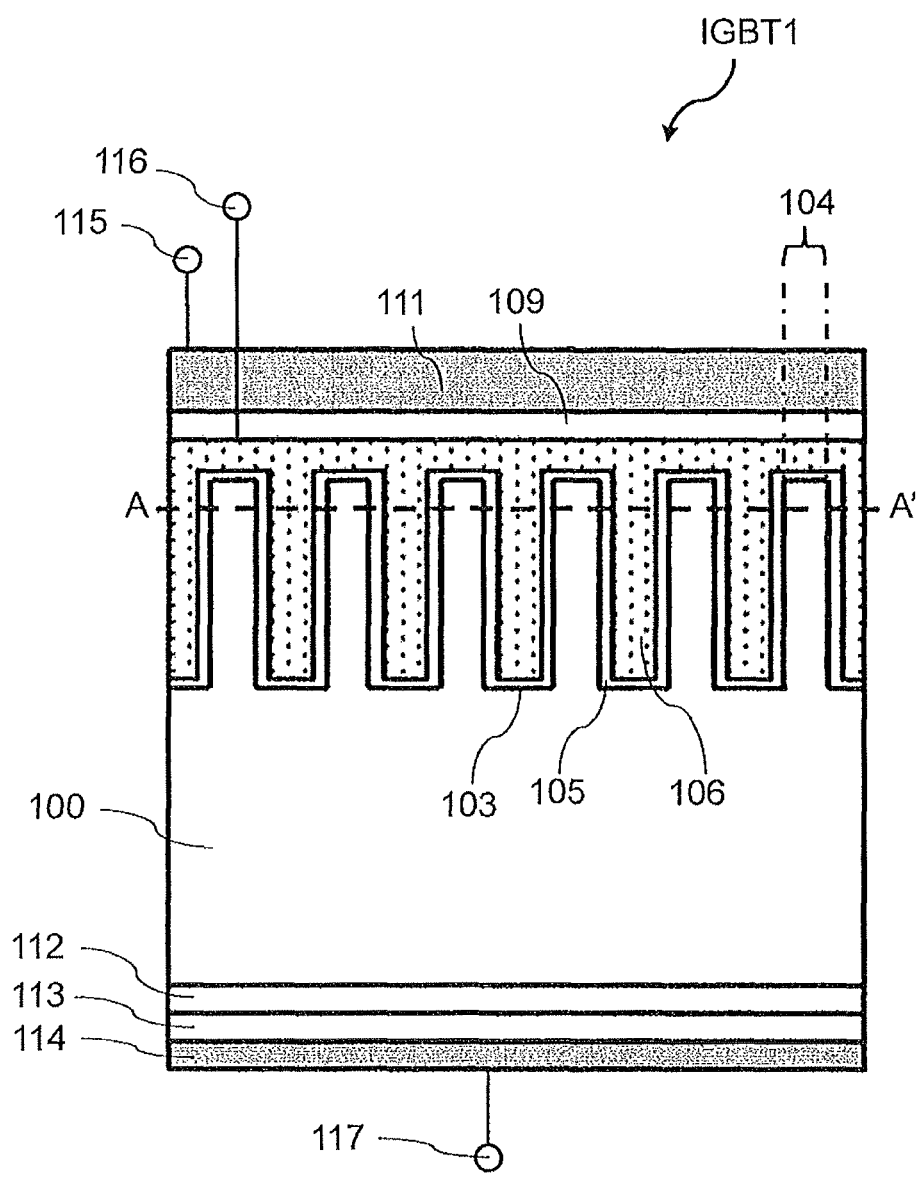
FIG. 4 is a sectional view, taken along plane D-D' in FIG. 1, of the semiconductor device IGBT1 according to the first embodiment of the present invention.

FIG. 1 is a sectional view to diagram illustrating a plan configuration of the semiconductor device IGBT1 according to the first embodiment of the present invention taken along the plane A-A' in FIGS. 2 to 4;

FIG. 2 is a sectional view taken along the plane B-B' in FIG. 1;

FIG. 3 is a sectional view taken along the plane C-C' in FIG. 1; and

FIG. 4 is a sectional view taken along the plane D-D' in FIG. 1.

<<Configuration of Semiconductor Device IGBT1>>

As shown in FIGS. 1 to 4, the semiconductor device IGBT1 according to the first embodiment includes: an n-drift layer (first semiconductor layer) 100; a p-base layer (third semiconductor layer) 101; an n+ source (fourth semiconductor layer) 102; a trench 103; a semiconductor protruding part 104; a gate insulating layer 105; a gate electrode (first conductive layer) 106; a first interlayer insulating layer 107; a field plate (second conductive layer) 108; a second interlayer insulating layer 109; a contacting part 110; an emitter electrode (third conductive layer) 111; an n-buffer layer 112; a p-collector layer (second semiconductor layer) 113; and a collector electrode (fourth conductive layer) 114.

In addition, an emitter terminal 115, a gate terminal 116 and a collector terminal 117 are virtual terminals for showing electrical connections.

In the sectional view of FIG. 2, the p-collector layer 113 (second semiconductor layer of second conductivity type) is formed on one of surfaces of the n-drift layer 100 (first semiconductor layer of first conductivity type) via the n-buffer layer 112. The collector electrode 114 (fourth conductive layer) is formed on the surface of the p-collector layer 113. The n-buffer layer 112 (fifth semiconductor layer of first conductivity type) is formed between the n-drift layer 100 and the p-collector layer 113.

Here, it is preferable to form the n-buffer layer 112, but may be omitted. More specifically, the p-collector layer 113 is formed on one of surfaces of the n-drift layer 100.

Further, the trenches 103 and the semiconductor protruding part 104 are formed in the surface of the n-drift layer 100 opposite to the p-collector layer 113. The semiconductor protruding part 104 are sandwiched between the trenches 103. The semiconductor protruding part 104 includes a part of the n-drift layer (first semiconductor layer) 100 and a current control part 120, between the trenches 103 in another surface of the n-drift layer 100. The current control part 120 comprises: the p-base layer 101 of the second conductivity type formed on a surface of the n-drift layer 100 between the trenches 103; and the n+ source (fourth semiconductor layer) 102 of the first conductivity type formed on a surface of the p-base layer (third semiconductor layer) 101 and having a higher impurity concentration than the n-drift layer (first semiconductor layer) 100.

The side surfaces of the semiconductor protruding part 104 correspond to vertical inner walls of the trenches 103.

The p-base layer 101, i.e. the third semiconductor layer of the second conductivity type, is formed on the surface of the n-drift layer (first semiconductor layer) 100 at a predetermined location (selectively) between the tranches 103. The n+ source 102 is selectively formed on the surface of the p-base layer 101. More specifically, at least one of the semiconductor protruding parts 104 is formed on the first semiconductor layer 100 at a predetermined location. The n+ source 102 is contiguous to the side surface of the trench 103.

Meanwhile, the semiconductor protruding part 104 may include a plurality of semiconductor layers. In other words, the semiconductor protruding part 104 may be configured by combining the n-drift layer 100, the p-base layer 101, and the n+ source 102 etc.

The gate insulating layer 105 is formed on and along a part of an inner wall of the trench 103. The gate electrode 106, i.e. the first conductive layer, is formed on the surface of the gate insulating layer 105. At least a part of the gate insulating layer 105 is sandwiched between the gate electrode 106 and the n+ source 102.

The first interlayer insulating layer 107 is formed on and along the rest of the inner wall of the trench 103. The field plate 108, i.e. the second conductive layer, is formed on the surface of the first interlayer insulating layer 107. The second interlayer insulating layer 109 covers the rest of the surface of the gate electrode 106 and the rest of the surfaces of the field plate 108.

Although polysilicon, i.e. a p-type conductive layer, is used in the example of FIG. 2, an n-type conductive layer may be used instead.

The contacting part 110 is a region for electrically connecting the p-base layer 101 and the emitter electrode 111, and is formed on the surface of the p-base layer 101. The emitter electrode 111, i.e. the third conductive layer, is formed on the surfaces of the contacting part 110, the n+ source 102, and the second interlayer insulating layer 109. The emitter electrode 111 is electrically connected to the n+ source 102 by contacting to the surface of the n+ source 102.

In addition, the emitter electrode 111 is electrically connected to the n+ source 102 via the contacting part 110 as well.

In the IGBT1 according to the first embodiment, the contacting part 110 is shown using the same kind of conducting material as the emitter electrode 111. However, a conducting material different from that of the emitter electrode 111 or a semiconductor, or combination thereof may be used.

Further, in the plane configuration according to the first embodiment shown in FIG. 1, the n+ source 102 is partitioned by the contacting part 110. However, a part of the n+ source 102 may be connected by penetrating the contacting part. According to this configuration, the semiconductor device operates as an insulated gate bipolar transistor. More specifically, the p-base layer 101 becomes a conductive state by controlling the gate electrode 106 via the gate terminal 116. Then, the controlled current flows between the emitter terminal 115 connected to the n+ source 102 and the collector terminal 117 connected to the p-collector layer 113.

The detailed operation will be explained later.

Here, other elements in FIGS. 1 to 4 are components necessary to implement the IGBT1 as a device.

<Advantageous Effects of the First Embodiment (IGBT1)>

Various advantages obtained by the aforementioned configuration according to the first embodiment will be described below.

<<First Advantage of the First Embodiment (IGBT1)>>

The first advantage of the IGBT1 according to the first embodiment is low loss. As shown in FIG. 1, in the plane configuration of the IGBT1, the trenches 103 are disposed in a stripe form. The trench 103 and the semiconductor protruding part 104 are arranged one after the other on an extended line in the longitudinal direction. Further the n+ source 102 is disposed on a part of the semiconductor protruding part 104. The values of the width L1 of the current control part 120 in the semiconductor protruding part 104 and the width L2 of the trench 103 in the longitudinal direction of the trench 103 meets the relation represented by L1<L2. The purpose of this relation is to reduce the on-voltage of the IGBT1. The detail will be explained below.

In the sectional view of FIG. 2, when the gate voltage applied on the gate electrode 106 rises, the IGBT1 becomes in a conductive state.

At this time, an electronic channel is formed in the vicinity of the gate insulating layer 105 of the p-base layer 101, and electron current flows from the n+ source 102 to the collector electrode 114. At the same time, hole current flows from the p-collector layer 113 to the emitter electrode 111.

Some part of the hole current flows under the trench 103, passes through the vicinity of the electron channel, and flows into the emitter electrode 111. The hole current passing under the trench 103 has an effect to increase the electron current from the channel. Thus the on-voltage of the IGBT1 is lowered.

Accordingly, as the hole current passing under the trench 103 is increased by making L2 longer than L1, the effect of lowering the on-voltage of the IGBT1 is large. Note that a typical ratio of L1 to L2 is between 1:2 and 1:10.

<<Second Advantage of the First Embodiment (IGBT1)-(1)>>

The second advantage of the first embodiment (IGBT1) is easiness of production. As shown in the cross-sections in FIGS. 3 and 4 each taken along the plane C-C' and the plane DD', the trench 103 and the semiconductor protruding part 104 are arranged one after the other in a width direction.

The purpose of this arrangement is to facilitate the design and manufacturing by eliminating a bump in the structure of the IGBT. The detail will be explained below.

Figure 5A:
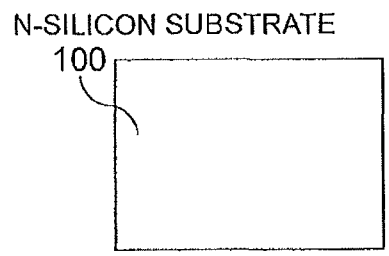
FIGS. 5A to 5J are side sectional views illustrating a manufacturing process of the semiconductor device IGBT1 according to the first embodiment of the present invention.

FIGS. 5A to 5J are sectional views illustrating an example of a manufacturing process of the semiconductor device IGBT1 according to the first embodiment of the present invention. As shown in FIG. 5A, the IGBT1 according to the first embodiment uses the n-silicon substrate 100. Here, the n-drift layer 100 in FIGS. 1 to 4 correspond to the n-substrate 100 in FIG. 5A.

Figure 5B:
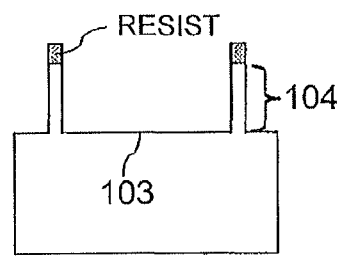

In a process shown in FIG. 5B, a resist is processed by patterning, and a trench 103 and a semiconductor protruding part 104 are formed by silicon etching.

Figure 5C:
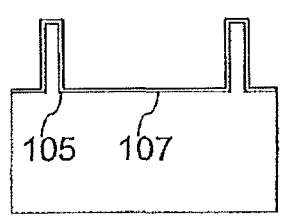

In a process shown in FIG. 5C, a gate insulating layer 105 and a first interlayer insulating layer 107 are formed by thermal oxidation.

Figure 5D:
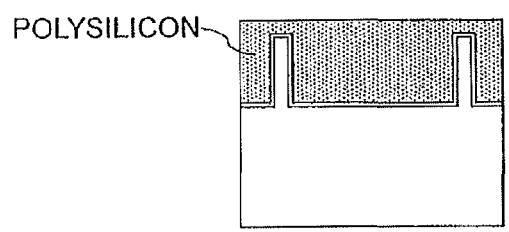

In a process shown in FIG. 5D, polysilicon is deposited.

Figure 5E:
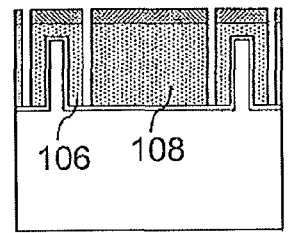

In a process shown in FIG. 5E, the polysilicon is partitioned and a gate electrode 106 and a field plate 108 are formed.

Figure 5F:
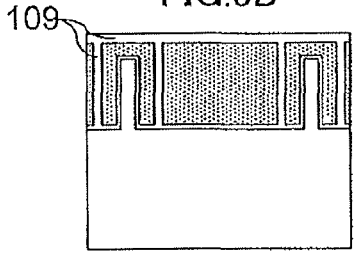

In a process shown in FIG. 5F, a second interlayer insulating layer 109 is formed by depositing an oxide film.

Figure 5G:
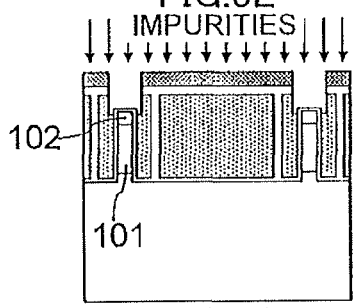

In a process shown in FIG. 5G, a part of the second interlayer insulating layer 109 and a part of the gate electrode 106 are etched, and a p-base layer 101 and an n+ source 102 are formed by separated ion implantation and anneal.

Figure 5H:
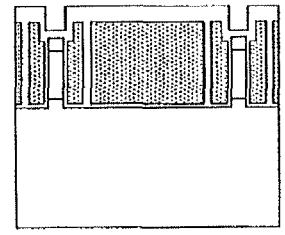

In a process shown in FIG. 5H, an oxide film is deposited. At this time, the second interlayer insulating layer 109 is formed again in some regions etched in the process of FIG. 5G.

Figure 5I:
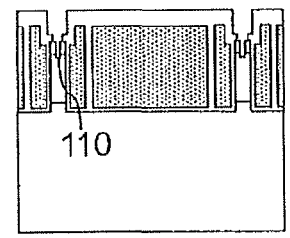

In a process shown in FIG. 5I, a contacting part 110 is formed by etching a part of the second interlayer insulating layer 109 and a part of the semiconductor protruding part 104.

Figure 5J:
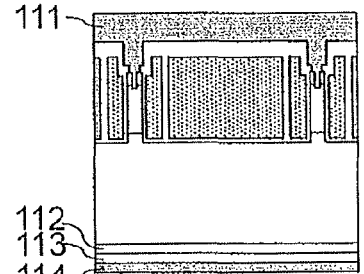

In a process shown in FIG. 5J, an emitter electrode 111 is deposited, an n-buffer layer 112 and a p-collector layer 113 are formed on the back side by separated ion implantation and anneal respectively, and a collector electrode 114 is deposited, thereby completing the IGBT1.

As shown in FIG. 3, in the cross-section taken along the plane C-C' in FIG. 1 showing the IGBT1 of the first embodiment, the trench 103 having a small width and the semiconductor protruding part 104 are arranged one after the other. The arrangement is made such that the width W2 of the trench 103 in the width direction is smaller than twice of the deposition thickness of the polysilicon.

This prevents the occurrence of a bump larger than 1 μm since the trench 103 is filled up with the oxide film and the polysilicon almost completely in the process of FIG. 5D.

Accordingly, there is an advantage that the design and manufacturing become easy since a problem due to a bump does not occur. It is preferable but not necessary that the width W2 of the trench 103 should be smaller than 4 μm since the typical deposition thickness of polysilicon is 1 μm to 2 μm.

According to the structure above, some problems described below due to a bump in a semiconductor device IGBT12 as a comparative example 2 can be prevented.
(IGBT as a Comparative Example (1))

FIGS. 22 to 25 show a structure of a semiconductor device IGBT12 as a comparative example 2. A comparative example 1 will be described later.

Figure 22:
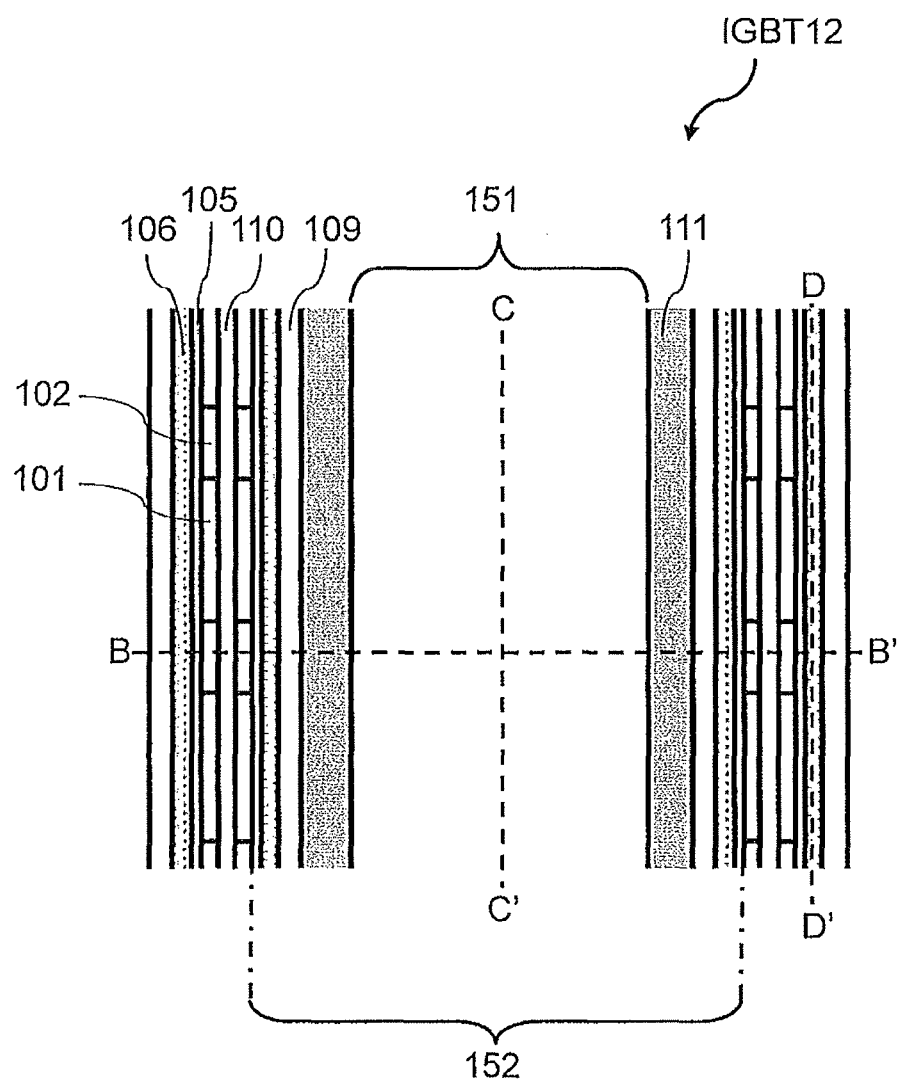
FIG. 22 is a sectional view, taken along a plane corresponding to plane A-A' in FIGS. 23 to 25, of a semiconductor device IGBT12 of a second comparative example to illustrate a horizontal arrangement in a horizontal planar view.
Figure 23:
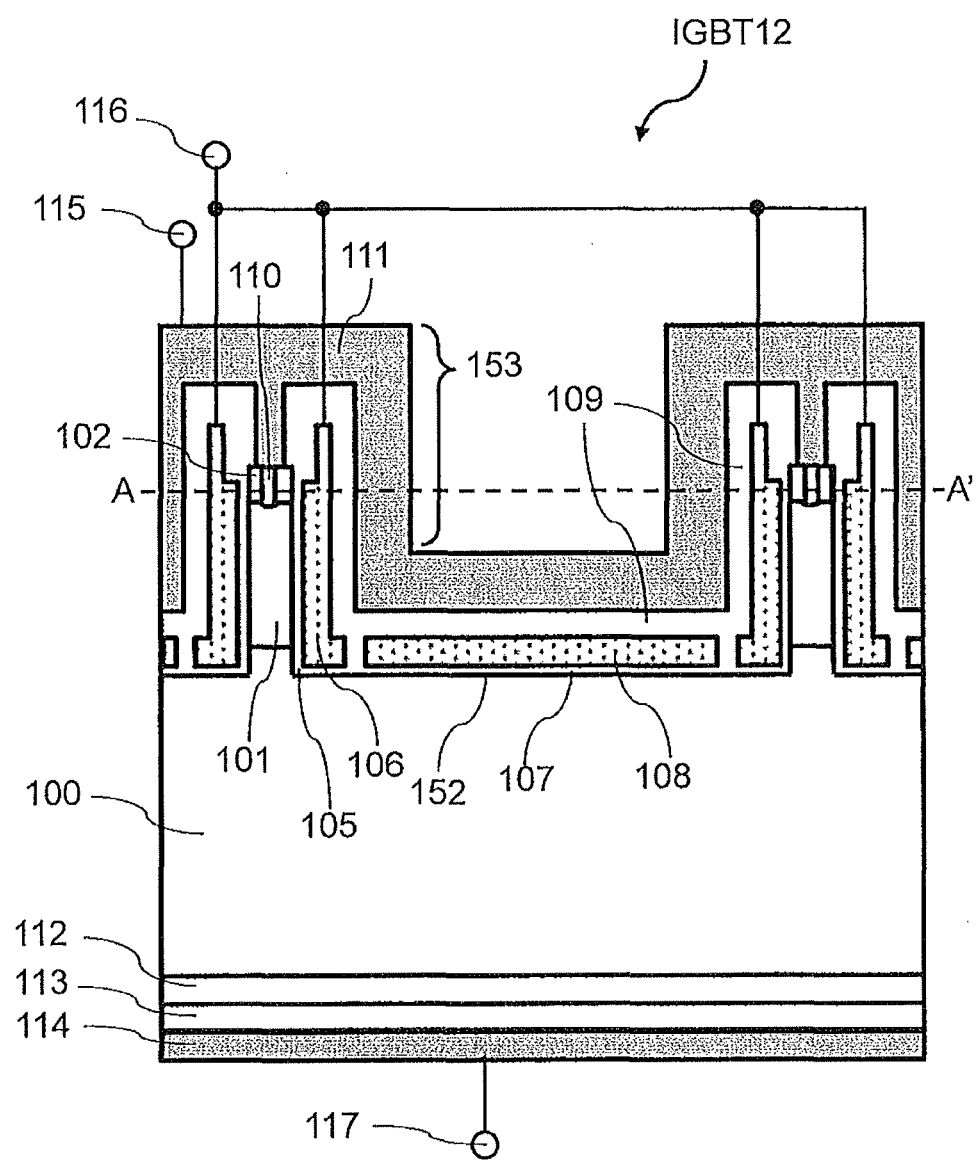
FIG. 23 is a sectional view taken along the plane B-B' in FIG. 22.
Figure 24:
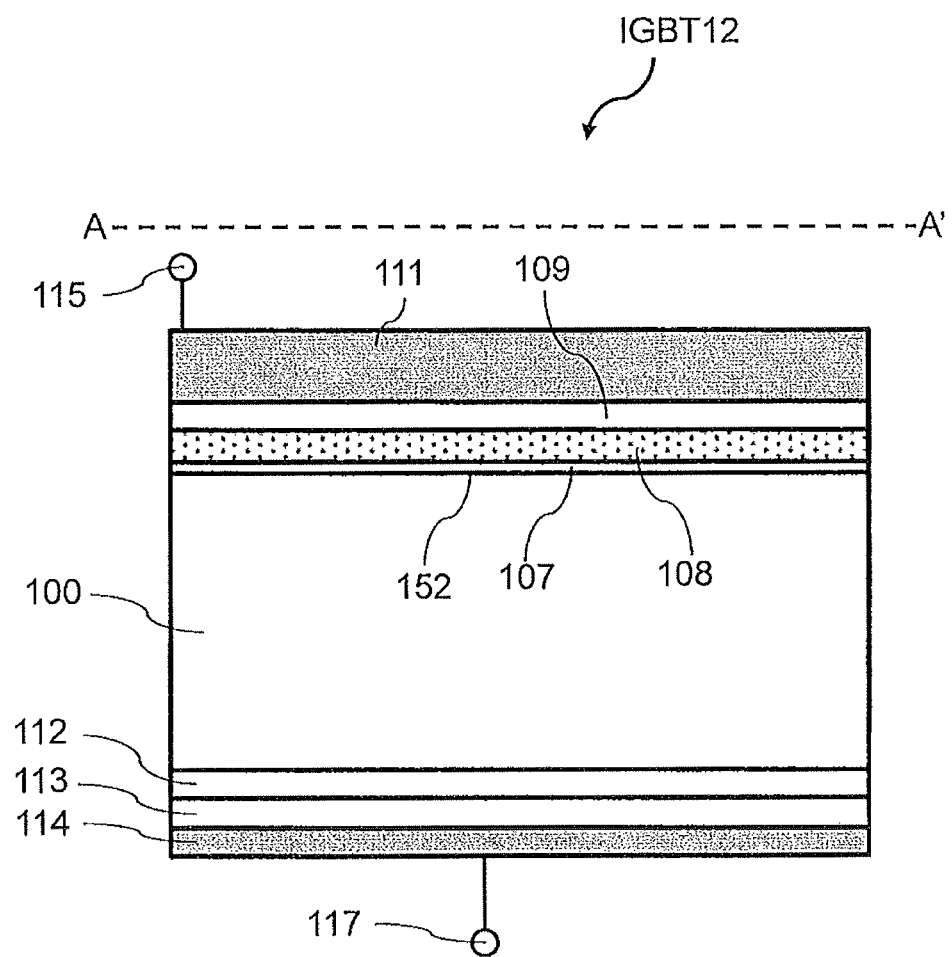
FIG. 24 is a sectional view taken along plane C-C' in FIG. 22.
Figure 25:
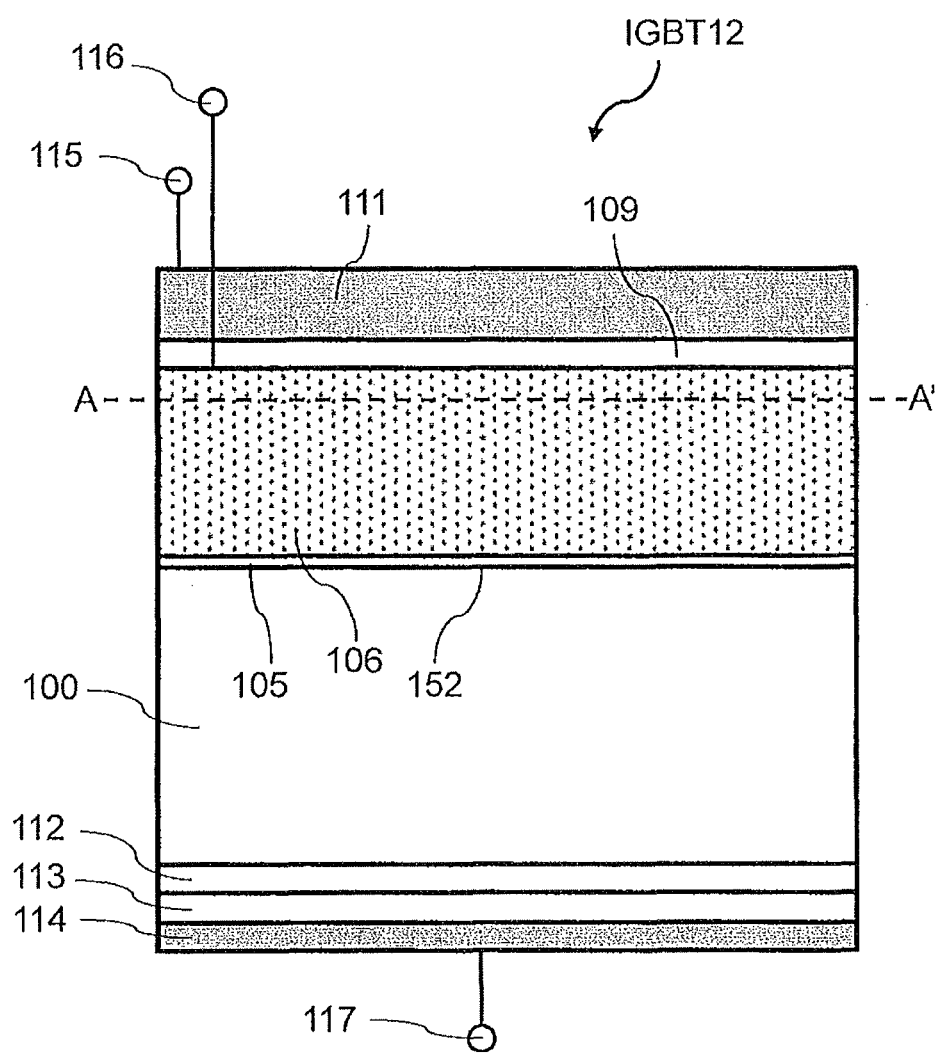
FIG. 25 is a sectional view taken along plane D-D' in FIG. 22.

FIG. 22 is a diagram showing a plane configuration of a semiconductor device IGBT12 taken along the plane A-A' in FIGS. 23 to 25. In FIG. 22, a region indicated with a numerical symbol 151 is a space (region) generated by a bump. A region indicated with a symbol 152 is a region of the trench.

FIG. 24 is a sectional view taken along the plane C-C' in FIG. 22. FIG. 25 is a sectional view taken along the plane D-D' in FIG. 22.

FIG. 23 is a sectional view of an IGBT12 as a comparative example 2 taken along the plane B-B' in FIG. 22.

For example, as shown in FIG. 23 in a case where a trench 152 having a large width is arranged, a bump 153 is generated on the surface of the emitter electrode 111 due to the bump of the trench 152. The bump of the emitter electrode 111 may cause a defect during a wiring process such as wire bonding to external terminals. Accordingly, it is desirable that the emitter electrode 111 should be flattened.

Another problem caused by a bump is related to processing of a resist used for photolithography in the manufacturing process of an IGBT.

FIGS. 26A to 26J are sectional views showing a supposed manufacturing process of the semiconductor device IGBT12 as a comparative example 2 shown in FIGS. 22 to 25.

Figure 26A:
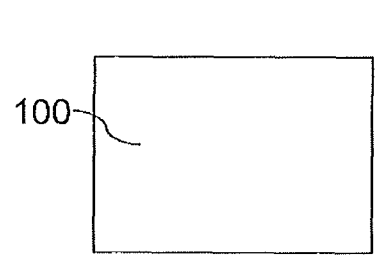
FIG. 26A to 26J are side sectional views illustrating a manufacturing process of the semiconductor device IGBT1 according to the first embodiment of the present invention the semiconductor device IGBT12 of the second comparative example shown in FIGS. 23 to 25.
Figure 26B:
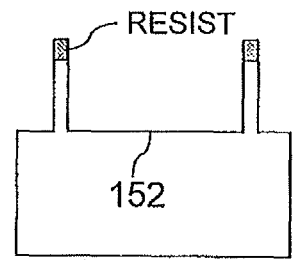
Figure 26C:
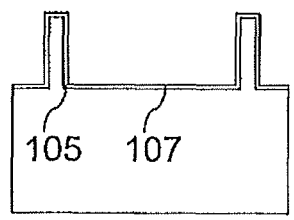
Figure 26D:
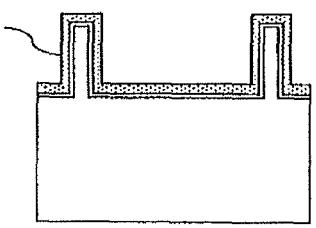
Figure 26E:
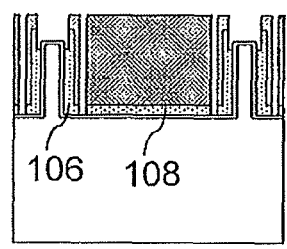
Figure 26F:
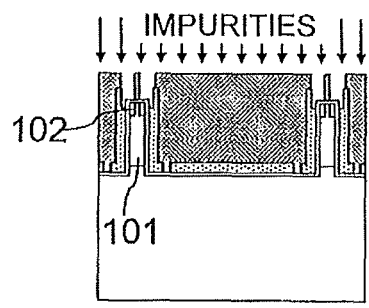
Figure 26G:
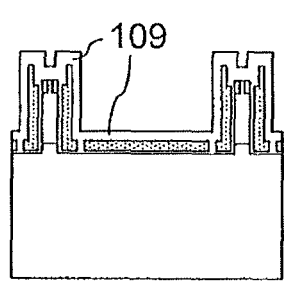
Figure 26H:
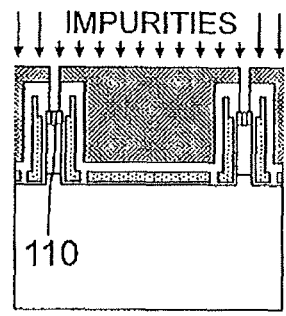
Figure 26I:
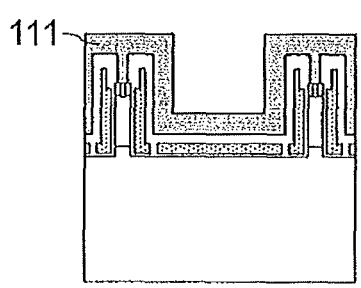
Figure 26J:
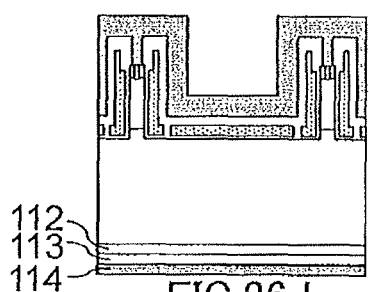

For example, in a forming process of the gate electrode 106 and the field plate 108 in FIG. 26E, the higher the bump becomes, the thicker the resist on the trench 152 becomes and the thinner the resist on the semiconductor protruding part 104 becomes.

Accordingly, in the IGBT shown in FIGS. 22 to 25, there may be a case where the resist is broken between the trench 152 and the semiconductor protruding part 104. Further, there may be a case where exposure of a resist on the thick trench 152 is not sufficient, and a defect due to a residue of the resist is caused. If the resist is made thicker and exposure is intensified to prevent such a defect, processing accuracy may be lowered and microscopic design may become difficult. Therefore, it is desirable that a bump in the manufacturing process of an IGBT should be small. The typical allowable range of a bump is 1 μm to 3 μm.

<<Second Advantage of the First Embodiment (IGBT1)-(2)>>

According to the IGBT1 of the first embodiment, it is possible to reduce defects in the wiring process to external terminals, breaks of the resist in the manufacturing process, and defects caused by a residue of the resist caused by the bump in the IGBT12 as a comparative example 2 described above.

<<Third Advantage of the First Embodiment (IGBT1)-(1)>>

A third advantage of the first embodiment IGBT1 is the controllability of dV/dt of the output voltage in turn-on operation. As shown in FIG. 2, among the side surfaces of the gate electrode 106, one side surface located opposite to the p-base layer 101 is opposed to the second interlayer insulating layer 109 and the field plate 108. According to this configuration, it is possible to make the parasitic capacitance of the gate insulating layer 105 lower than that of the IGBT11 as a comparative example 1 (FIG. 19) for example.

As a result, feedback capacity between the gate and collector can be decreased.

In addition, since a floating p-layer 180 used in the IGBT11 as a comparative example 1 (FIG. 19) does not exist, a rise of gate potential in turn-on operation can be suppressed. As a result, the dV/dt can be easily controlled, and the first objective described before can be achieved.

Meanwhile, the detail of the IGBT11 as a comparative example 1 (FIG. 19) will be described later.

Further, in the sectional view of the IGBT1 according to the first embodiment taken along the plane C-C' in FIG. 3, the semiconductor protruding part 104 which is sandwiched by the field plate 108 is formed by the n-drift layer 100.

Accordingly, since a floating p-layer 180 is not used, a transitional rise of gate potential in the turn-on operation of the IGBT1 can be suppressed, and the rate dV/dt of the IGBT1 and the diode (505 in FIG. 28) are easily controlled.

Figure 21:
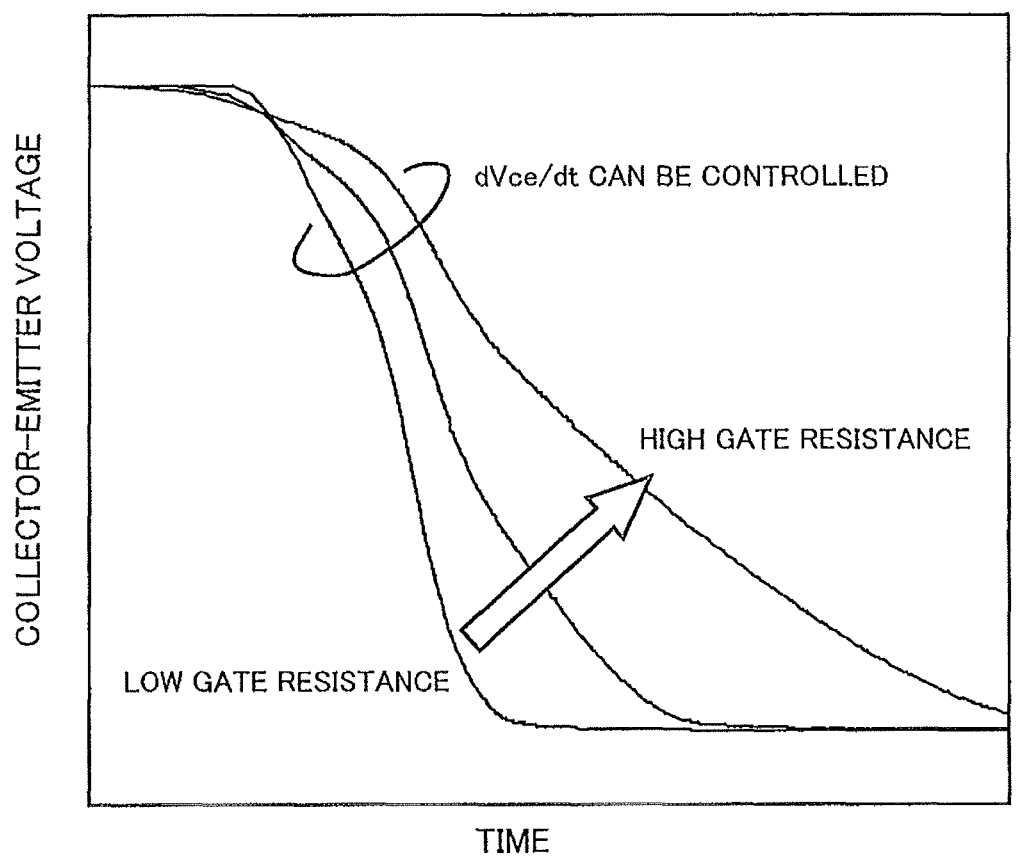
FIG. 21 is a chart showing a graph of calculated values of the collector-emitter voltage Vce in turn-on operation of the semiconductor device IGBT1 according to the first embodiment of the present invention.

FIG. 21 is a diagram showing a graph of calculated values of collector-emitter voltage Vce in turn-on operation of the semiconductor device IGBT1 according to the first embodiment.

As shown in FIG. 21, the dVce/dt of the collector-emitter voltage Vce is controlled by changing gate resistance.
(IGBT as a Comparative Example (2))

Figure 19:
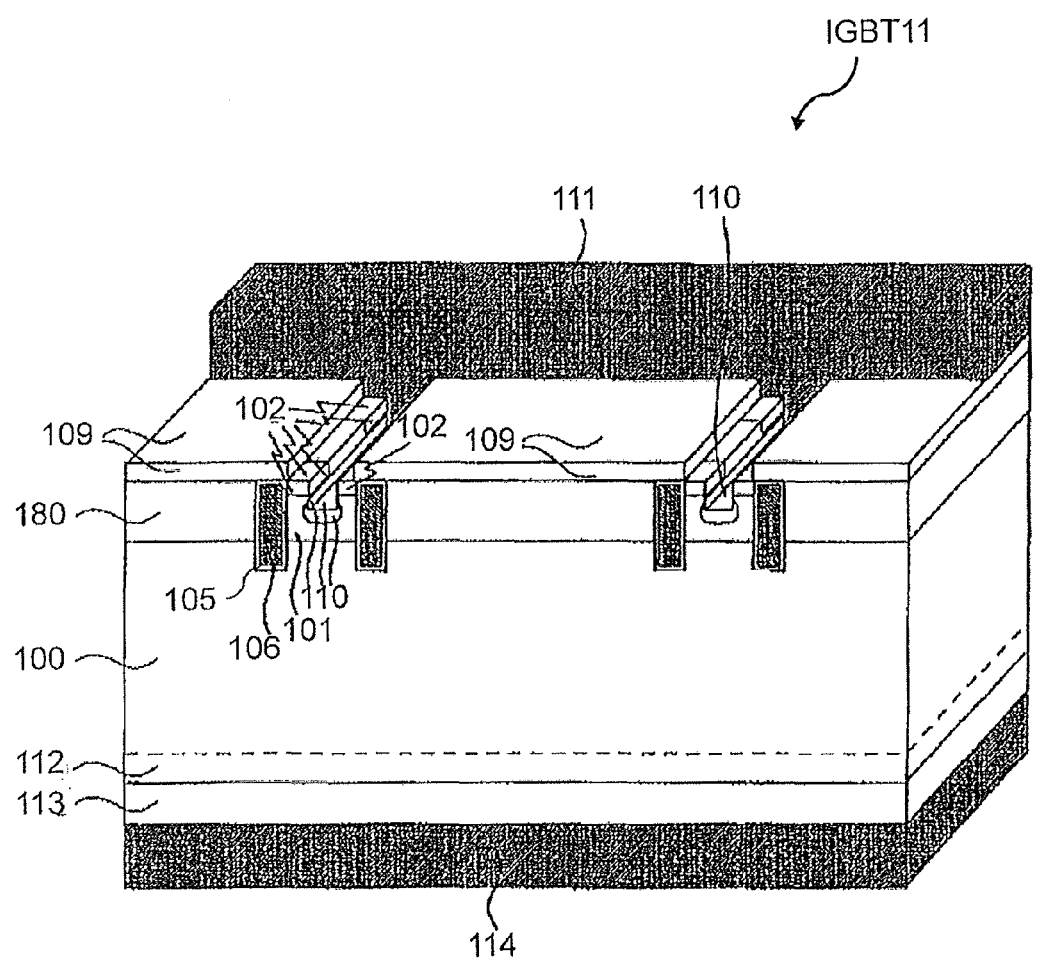
FIG. 19 is a perspective view of a cross-section showing a structure of a semiconductor device IGBT11 as a first comparative example.
Figure 20:
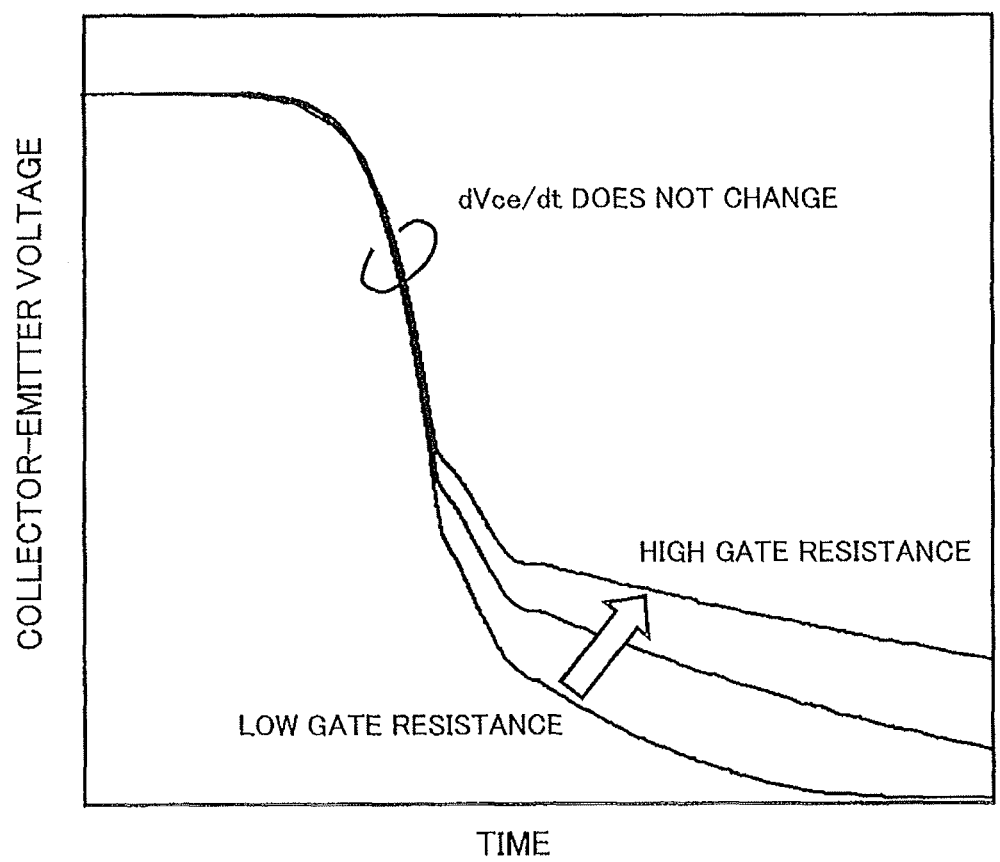
FIG. 20 is a chart showing a graph of calculated values of the collector-emitter voltage Vce in turn-on operation of the semiconductor device IGBT11 of the first comparative example.

FIG. 20 is a diagram showing a graph of calculated values of collector-emitter voltage Vce in turn-on operation of the semiconductor device IGBT11 (FIG. 19) as a comparative example 1.

As shown in FIG. 20, there is a period of time where the dVce/dt cannot be controlled by changing the gate resistance. This phenomenon will be described later in detail.

<<Third Advantage of the First Embodiment (IGBT1)-(2)>>

As described above, in the IGBT1 according to the first embodiment, since a floating p-layer 180 used in the IGBT11 (FIG. 19) as a comparative example 1 does not exist, the rate dV/dt of the IGBT1 and the diode (505 in FIG. 28) can be easily controlled, and reliability as an electric power conversion system is assured.

<<Fourth Advantage of the First Embodiment (IGBT1)>>

The fourth advantage of the first embodiment IGBT1 is a high breakdown voltage.

Figure 6:
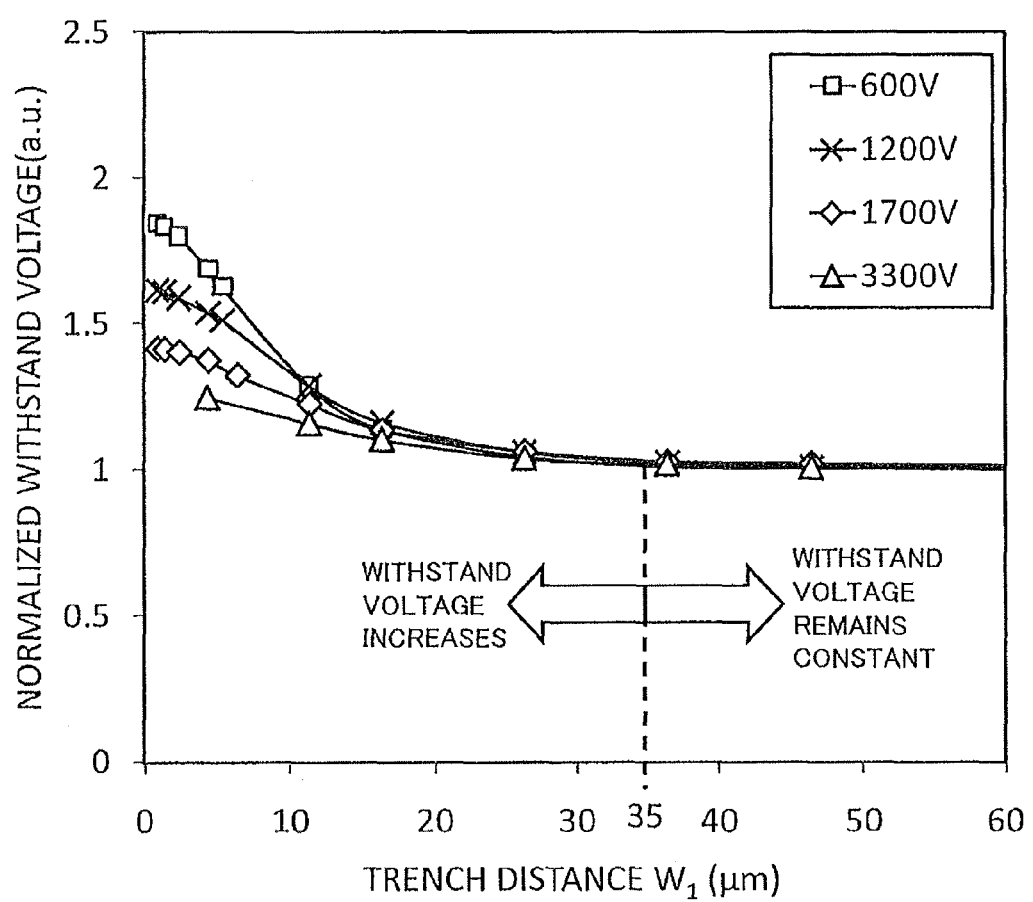
FIG. 6 is a diagram illustrating calculation results of withstand voltages between the collector and the emitter in an off-state of the semiconductor device IGBT1 according to the first embodiment of the present invention.

FIG. 6 is a diagram illustrating calculation results of withstand voltages between the collector and the emitter in an off-state of the semiconductor device IGBT1 according to the first embodiment of the present invention, i.e. illustrating calculation results of withstand voltages relative to the width W1 of the semiconductor protruding part 104.

In FIG. 6, the horizontal axis represents the trench distance W1 which corresponds to the semiconductor protruding part 104, and the unit is μm. The vertical axis represents a normalized withstand voltage using the withstand voltage when the trench distance exceeds 35 μm as the reference value 1, and the unit is a.u. (Arbitrary Unit).

As shown in FIG. 6, the withstand voltage becomes nearly constant when W1>35 μm in the IGBT1 with the rated voltage of 600V to 3300V. When W1≤35 μm, the smaller the W1 becomes the higher the withstand voltage becomes. Accordingly, it is preferable that W1 should be less than or equal to 35 μm to ensure a high breakdown voltage.

According to the IGBT1 of the first embodiment of the present invention as stated above, since the trench distance W1 is easily controlled to be lower than or equal to 35 μm, the high breakdown voltage can be assured.

Note that, the withstand voltage is lowered when the trench distance W1 which corresponds to the semiconductor protruding part 104 becomes large. This is because equipotential lines are gathered in a lower corner of the trench, and the field intensity rises.

Thus the IGBT1 according to the first embodiment provides a low loss, a high breakdown voltage, and high controllability of the rate dV/dt of the output voltage. In addition, there is an advantage that the production is easy.

Second Embodiment IGBT2

Next, will be explained a semiconductor device IGBT2, i.e. the second embodiment of the present invention.

<<Configuration of Semiconductor Device IGBT2>>

Figure 7:
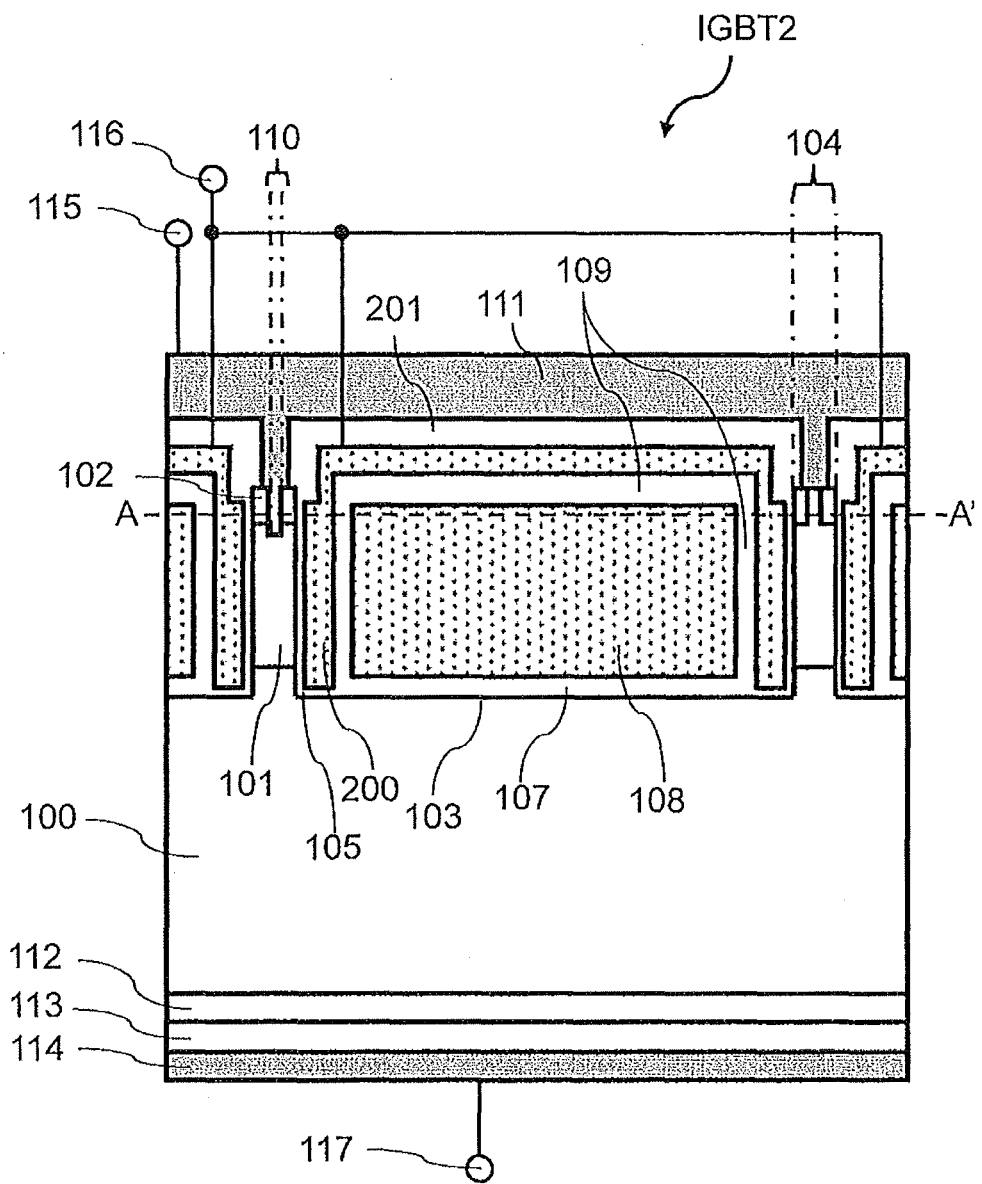
FIG. 7 is a sectional view of a semiconductor device IGBT2 according to a second embodiment of the present invention.

FIG. 7 is a sectional view illustrating a structure of a semiconductor device IGBT2 according to the second embodiment of the present invention, showing the cross-section taken along the plane B-B' in FIG. 1.

In FIG. 7, differences from FIG. 2 are a gate electrode 200 (first conductive layer), a second interlayer insulating layer 109, and a third interlayer insulating layer 201. Components having other symbols have the same structure, behavior and function as shown in FIGS. 1 to 4 with the same symbols, and therefore the explanation will be omitted.

In the IGBT2, a part of the gate electrode 200 covers at least a part of the surface of the second interlayer insulating layer 109. The surface of the gate electrode 200 is covered with the third interlayer insulating layer 201, and the surface of the third interlayer insulating layer 201 is covered with the emitter electrode 111.

The purpose of the IGBT2 according to the second embodiment is to suppress oscillation of voltage and current in turn-on and turn-off operation. The detail will be explained below.

In the IGBT2 according to the second embodiment, the gate electrode 200 is formed on the second interlayer insulating layer 109, thereby widening the area and reducing the wiring resistance of the gate electrode 200. By reducing the wiring resistance of the gate electrode 200, the delay time of the gate voltage signal for reaching all of the gate electrodes 200 can be reduced.

In addition, fluctuation of delay time of the gate voltage may cause oscillation of the voltage and current. Therefore, the IGBT2 according to the second embodiment is capable of suppressing the oscillation by lowering the wiring resistance of the gate electrode 200.

<<Configuration of Semiconductor Device IGBT2B as a Modified Example According to the Second Embodiment>>

Figure 8:
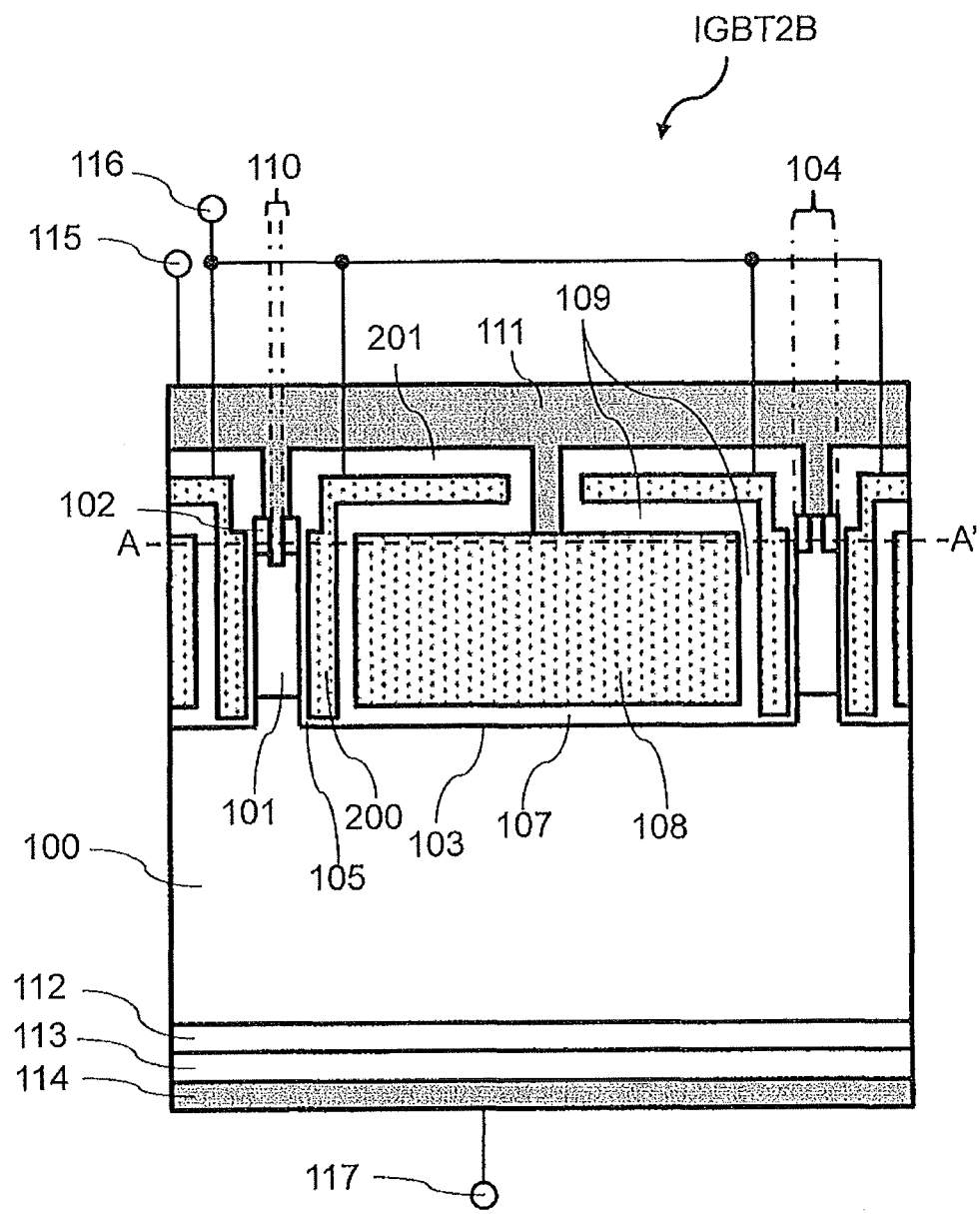
FIG. 8 is a sectional view of a modification of a semiconductor device IGBT2B according to the second embodiment of the present invention.

FIG. 8 is a sectional view illustrating a structure of semiconductor device IGBT2B as a modified example according to the second embodiment of the present invention.

A difference between the semiconductor device IGBT2B (FIG. 8) and the IGBT2 (FIG. 7) is that, as shown in FIG. 8, a part of the emitter electrode 111 contacts to the field plate 108 and electrically connected.

As a result, the field plate 108 and the emitter electrode 111 have the same electrical potential, and the characteristics become stable.

As stated before, a difference between FIGS. 8 and 7 is the structure of the emitter electrode 111 and the field plate 108. Components shown with other symbols have the structures, effects and functions same as those shown in FIG. 7 with the same symbols, and therefore the explanation will be omitted.

Third Embodiment IGBT3

The semiconductor device IGBT3, i.e. the third embodiment of the present invention, will be explained with reference to FIGS. 9 and 10.

Figure 9:
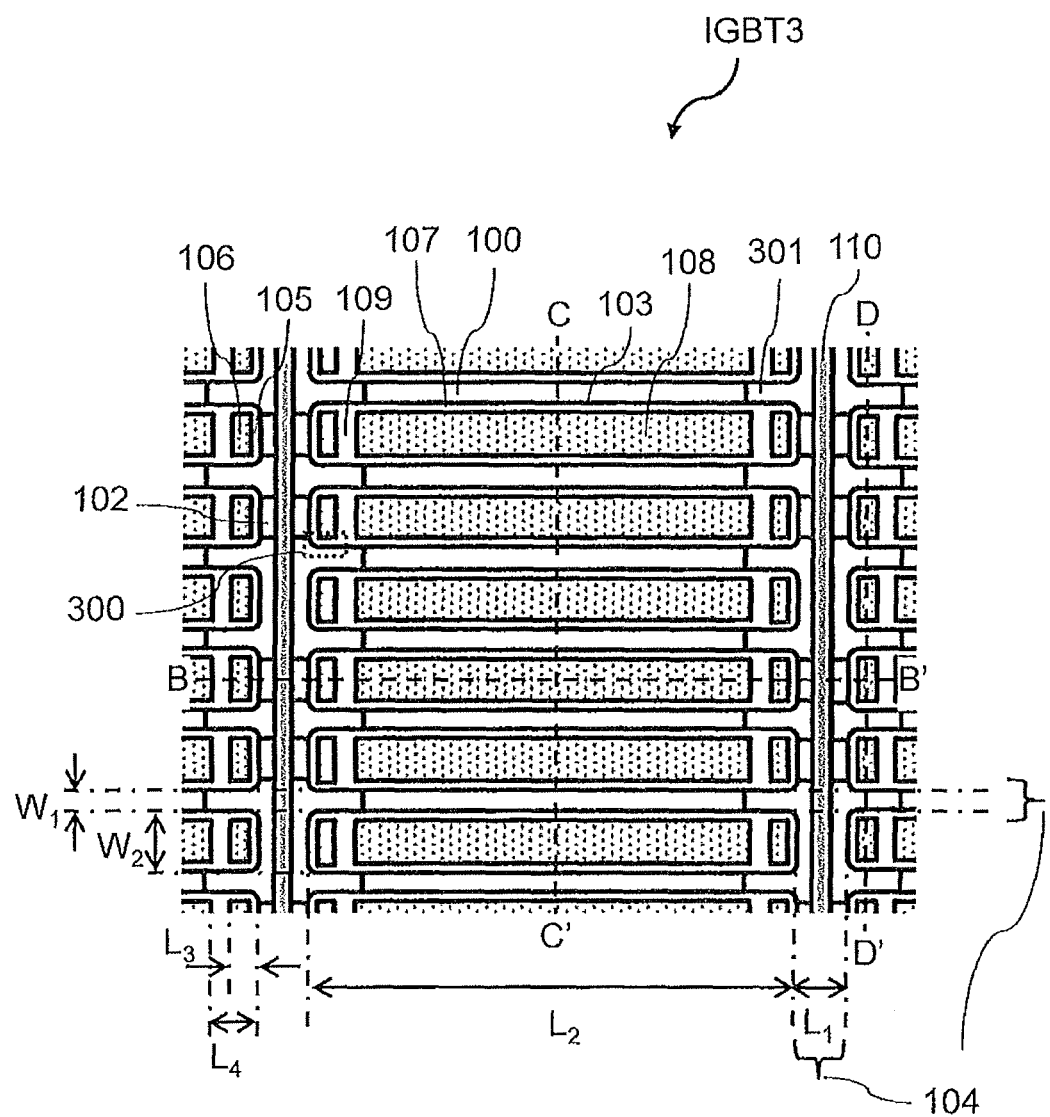
FIG. 9 is a sectional view, taken along plane A-A' in FIG. 10, of a semiconductor device IGBT3 according to a third embodiment of the present invention to illustrate a horizontal arrangement in a horizontal planar view.
Figure 10:
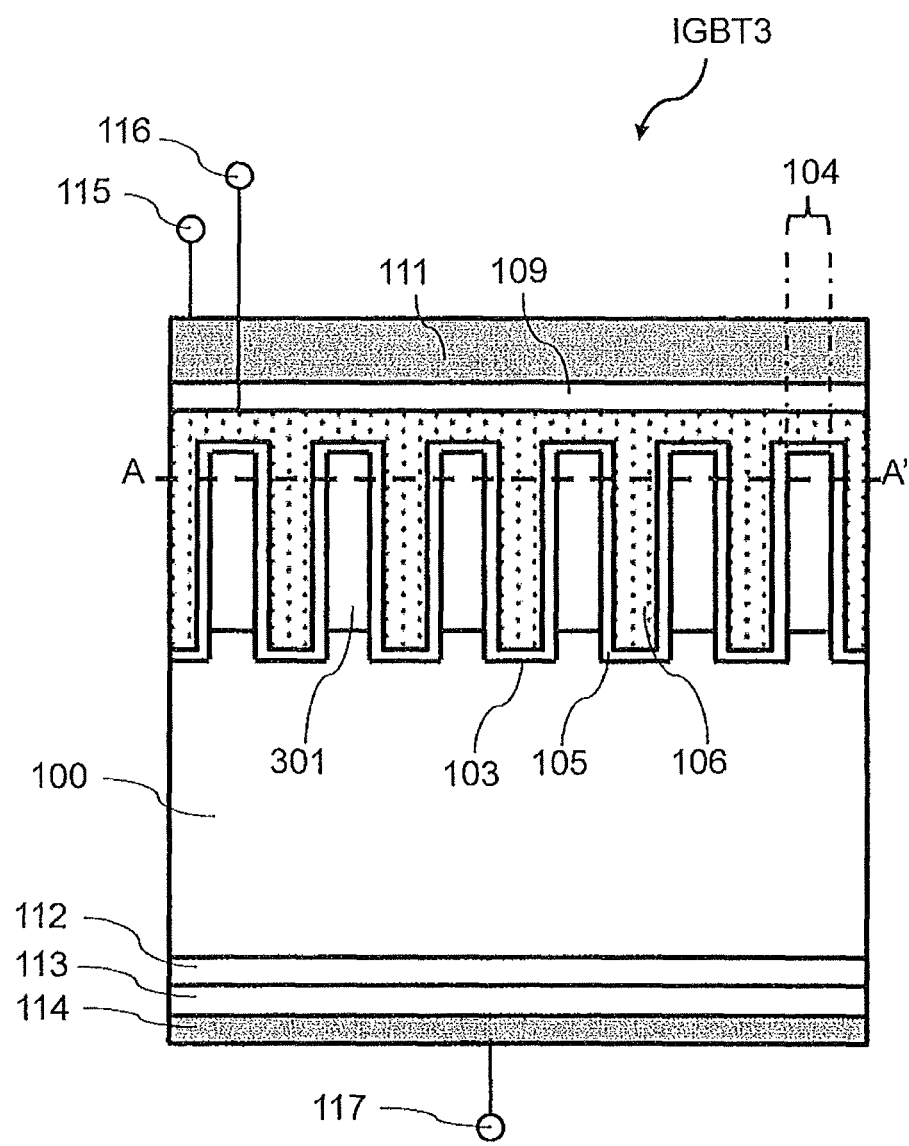
FIG. 10 is a sectional view, taken along plane D-D' in FIG. 9, of the semiconductor device IGBT3 according to the third embodiment of the present invention.

FIG. 9 is a diagram illustrating a plane configuration of a semiconductor device IGBT3 according to the third embodiment of the present invention taken along the plane A-A' in FIG. 10.

FIG. 10 is a sectional view taken along the plane D-D' in FIG. 9.

The sectional view taken along the planes B-B' and C-C' in FIG. 9 are the same as those of the FIGS. 2 and 3 respectively.

In FIG. 9, the p-base layer 301 covers the circumference of the gate electrode 106 with the gate insulating layer 105 therebetween.

The purpose of this structure is, in an on-state of the IGBT3, to prevent a plurality of channels having different thresholds from being formed on a gate side-wall 300 opposed to the trench 103 in a width direction in an on-state of the IGBT3, and to improve the breakdown tolerance. The detail will be described below. In other words, the third semiconductor layer 301 covers a circumference of side-wall 300 of the first conductive layer 106. More specifically, a length L4 from the wall of trench 103 confronting the first conductive layer 106 to a tip of the third semiconductor layer 301 in the longitudinal direction of the trench 103 is larger than a length L3 from the wall of trench 103 confronting the first conductive layer 106 to the surface opposed to the confronting surface of the conductive layer 106 in a plan view as shown in FIG. 9.

The threshold voltage of the IGBT varies according to impurity concentration of the p-base layer. The impurity concentration of the p-base layer may have non-constant distribution in a depth direction (more specifically a direction vertical to the plane of FIG. 1 or FIG. 9).

Accordingly, as shown in the IGBT1 according to the first embodiment in a case where a part of the gate electrode 106 and the gate insulating layer 105 are not covered with the p-base layer 101, a plurality of horizontal channels (i.e. channels in a direction parallel to the plane of FIG. 1) having different thresholds may be formed on the gate side-wall 300 in a depth direction.

In the IGBT having a plurality of thresholds, electric current may be concentrated when the IGBT is turned off, and the breakdown tolerance may be lowered.

The IGBT3 according to the third embodiment has an effect to prevent horizontal channels from being formed on the gate side-wall 300 by the p-base layer 301 covering the gate side-wall 300. Accordingly, the IGBT3 has an effect to improve breakdown tolerance when the IGBT3 is turned off since the IGBT3 does not have a plurality of thresholds.

Differences between FIGS. 9, 10 and FIGS. 1, 4 respectively are the structures of the p-base layer 301 and the gate side-wall 300. Components shown with other symbols have the same structures, effects and functions as those shown in FIGS. 1 and 4 with the same symbols, and therefore the explanation will be omitted.

<<Configuration of Semiconductor Device IGBT3B as a Modified Example According to the Third Embodiment>>

The configuration of semiconductor device IGBT3B as a modified example according to the third embodiment will be explained with reference to FIGS. 11 to 13.

Figure 11:
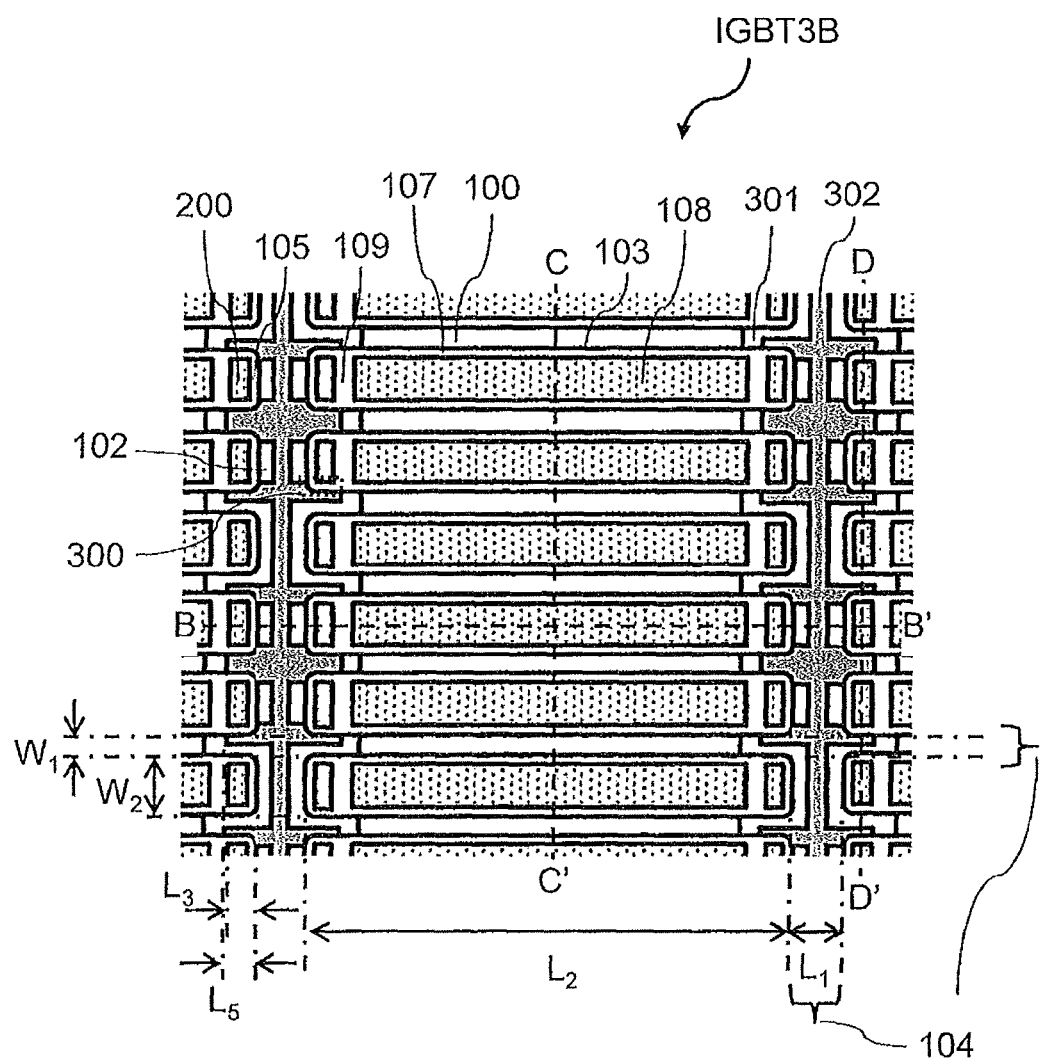
FIG. 11 is a diagram illustrating a plane configuration of a semiconductor device IGBT3B as a modified example according to the third embodiment of the present invention taken along plane A-A' in FIGS. 12 and 13.
Figure 12:
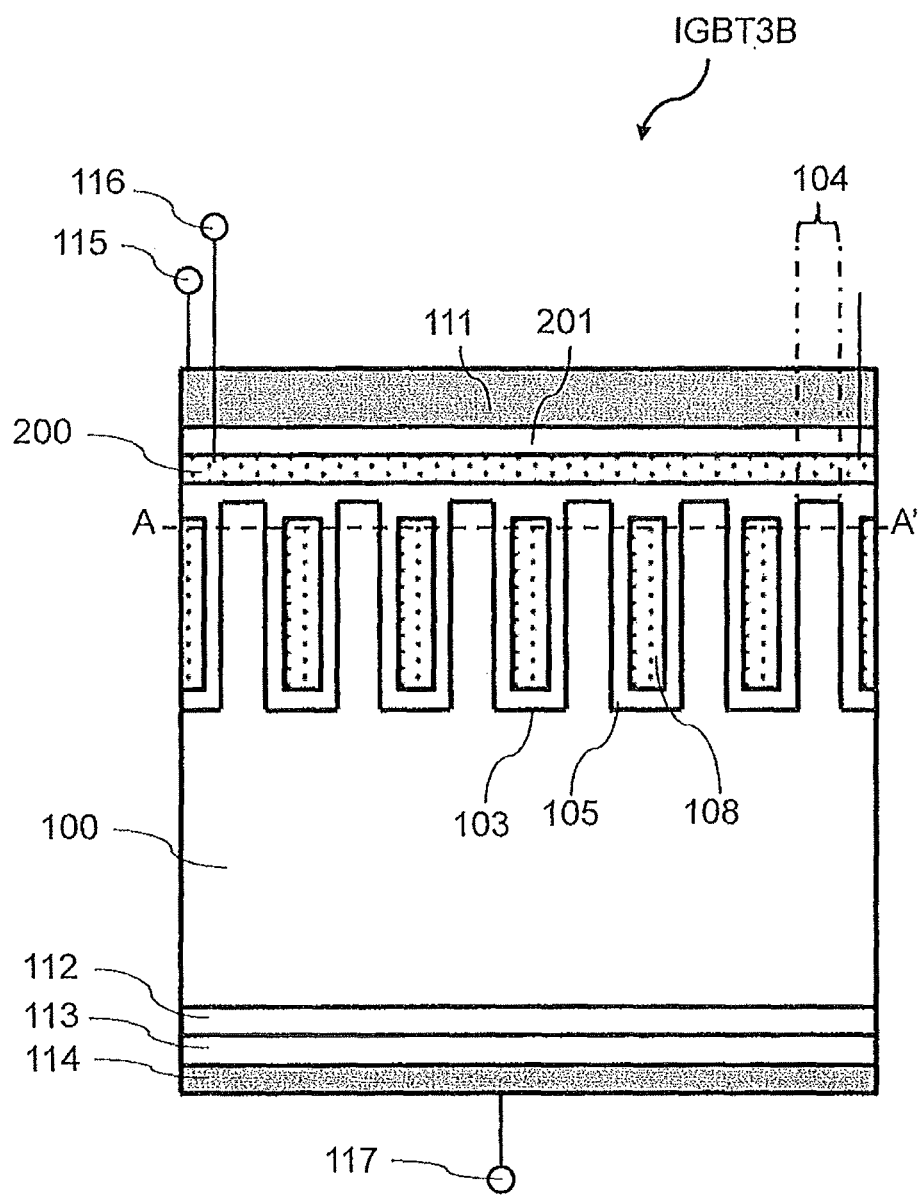
FIG. 12 is a sectional view taken along plane C-C' in FIG. 11.
Figure 13:
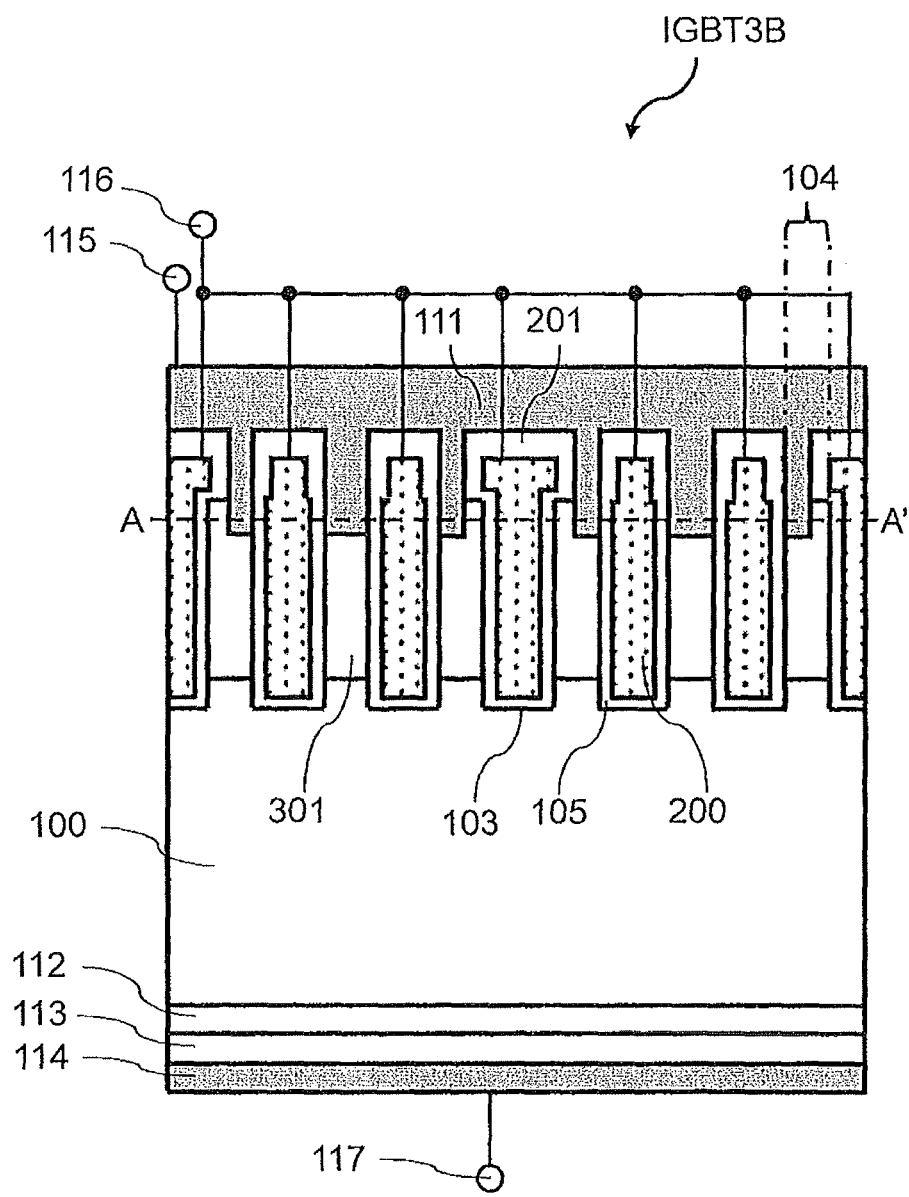
FIG. 13 is a sectional view taken along plane D-D' in FIG. 11.

FIG. 11 is a diagram illustrating a plane configuration of a semiconductor device IGBT3B according to the third embodiment of the present invention taken along the plane A-A' in FIGS. 12 and 13.

FIG. 12 is a sectional view taken along the plane C-C' in FIG. 11.

FIG. 13 is a sectional view taken along the plane D-D' in FIG. 11.

The sectional view taken along the plane B-B' in FIG. 11 is the same as the sectional view shown in FIG. 7.

The IGBT3 has an effect to prevent horizontal channels from being formed on the gate side-wall 300 by the contacting part 302 covering the gate side-wall 300, and to improve breakdown tolerance when the IGBT3 is turned off. In this regard, the gate electrodes 200 located between the trenches are divided at the cross-section taken along BB'. As a result, the each gate electrode 200 between the trenches is connected to the field plate 108 on an upper part thereof. Further, the gate electrode 200 in the cross-section taken along BB' has a shape different from that of the gate electrode 106 in FIG. 10. In FIG. 13, the emitter electrode 111 is embedded into the contacting part (302).

In FIG. 11, the contacting part 110 covers a side-wall of the first conductive layer 106. More specifically, a length L5 from the wall of trench 103 confronting the first conductive layer 106 to a tip of the contacting part 302 in the longitudinal direction of the trench 103 is larger than a length L3 from the wall of trench 103 confronting the first conductive layer 106 to the surface opposed to the confronting surface of the conductive layer 106 in a plan view as shown in FIG. 11.

Differences between FIGS. 11, 12, 13, and FIGS. 9, 3, 10 respectively are the structures of the contacting part 302 and the gate electrode 200. Components shown with other symbols have the same structures, effects and functions as those shown in FIGS. 9, 3 and 10 with the same symbols, and therefore the explanation will be omitted.

Fourth Embodiment IGBT4

The semiconductor device IGBT4, i.e. the fourth embodiment of the present invention, will be explained with reference to FIGS. 14 to 16.

Figure 14:
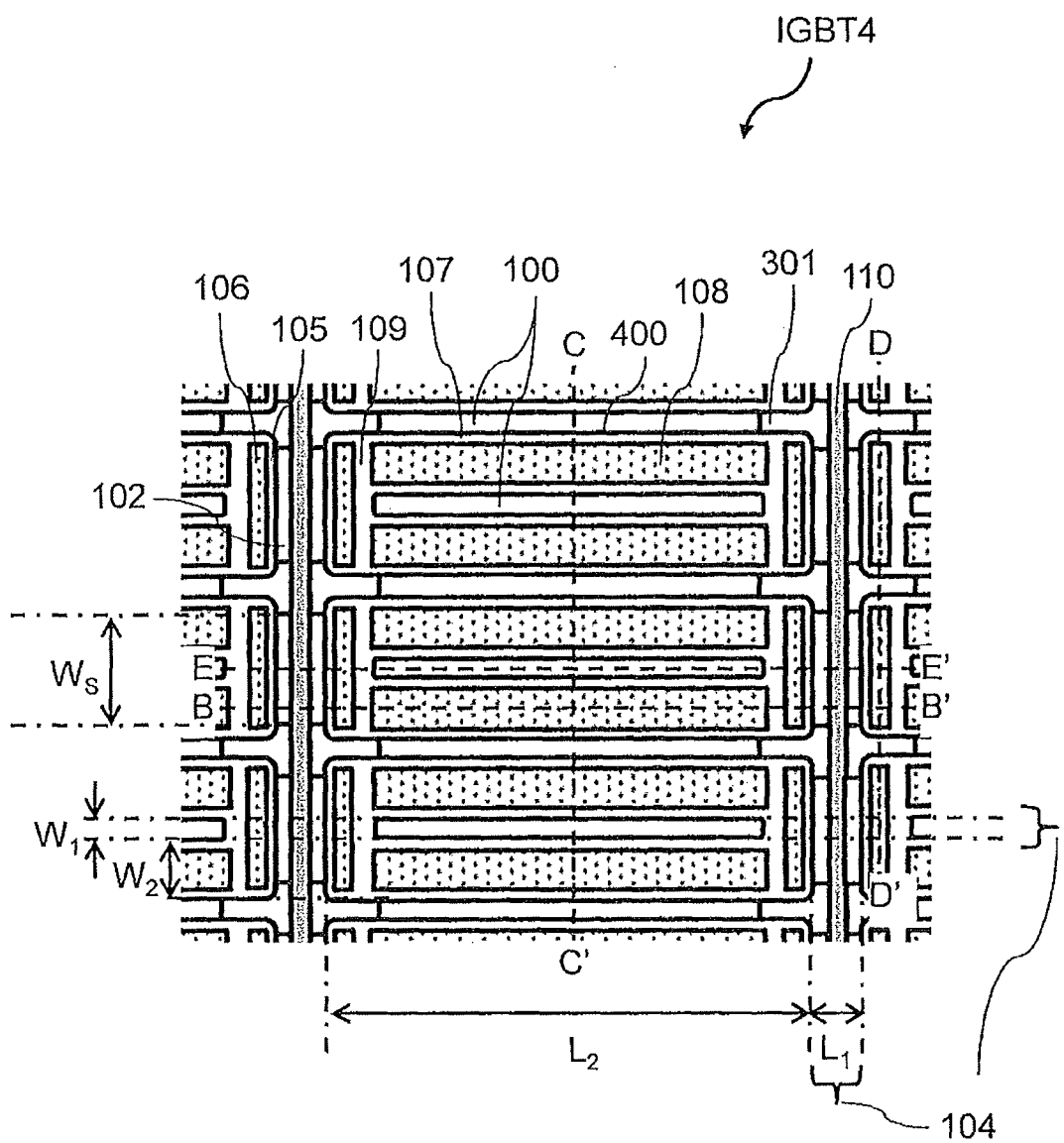
FIG. 14 is a sectional view, taken along plane A-A' in FIGS. 15 and 16, of a semiconductor device IGBT4 according to a fourth embodiment of the present invention to illustrate a horizontal arrangement in a horizontal planar view.
Figure 15:
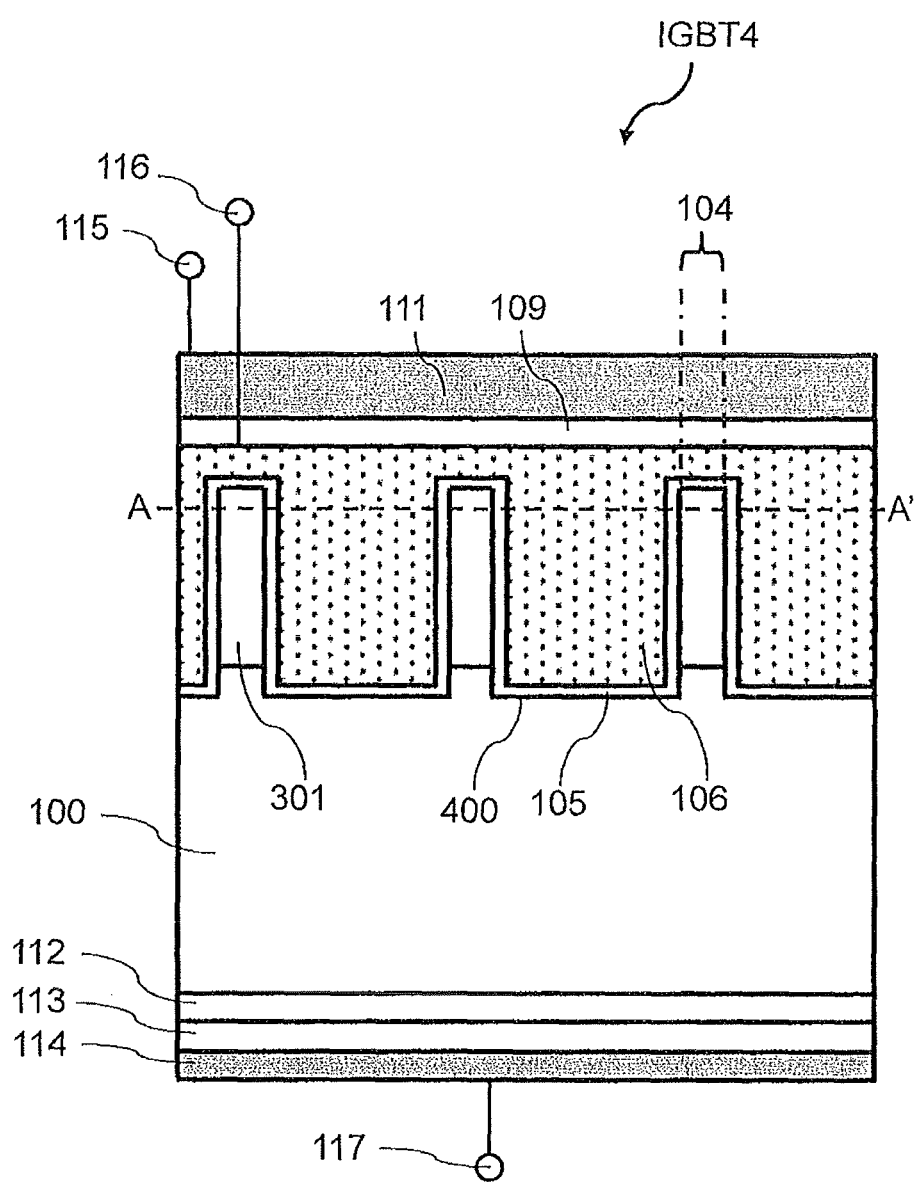
FIG. 15 is a sectional view taken along plane D-D' in FIG. 14.
Figure 16:
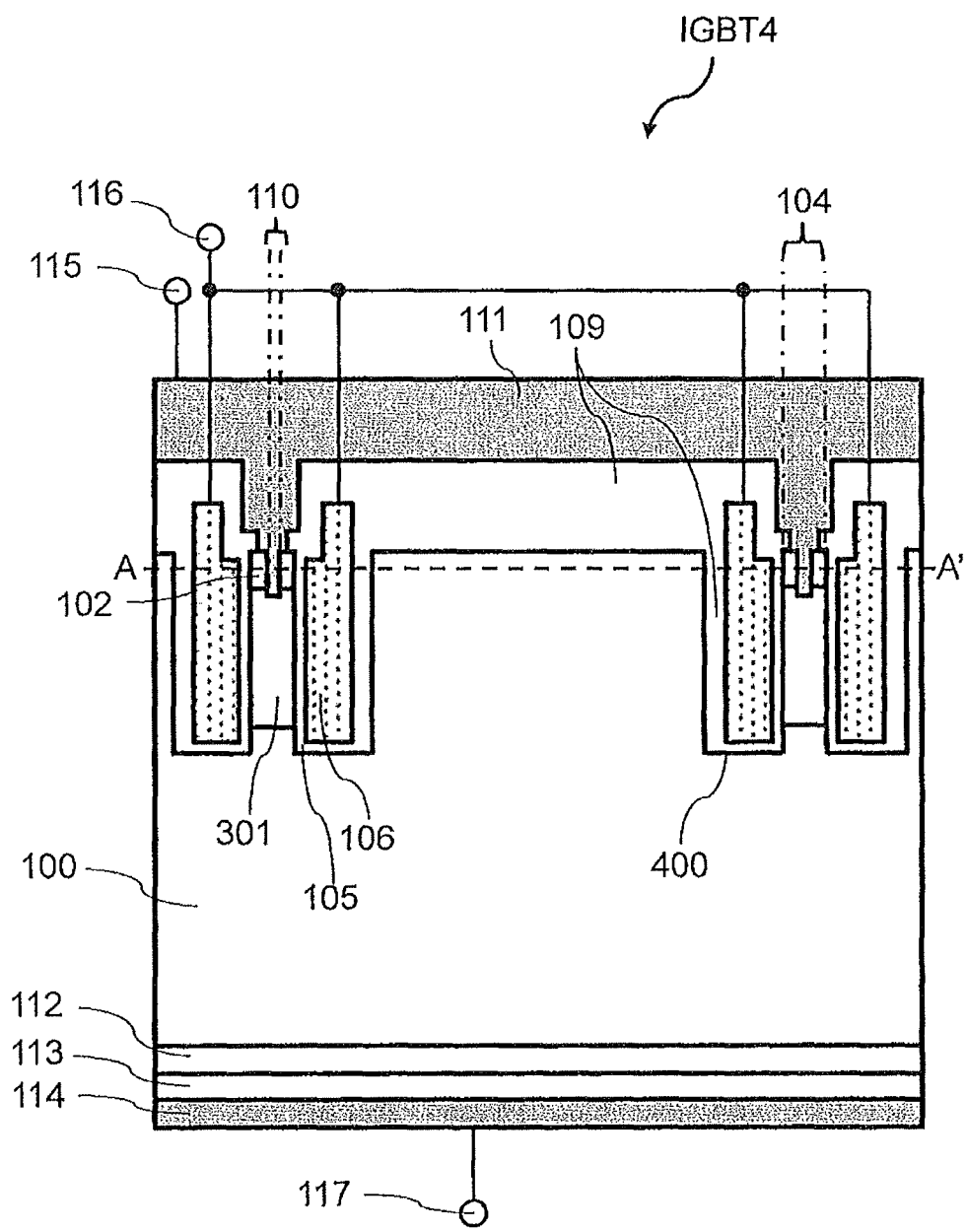
FIG. 16 is a sectional view taken along plane E-E' in FIG. 14.

FIG. 14 is a diagram illustrating a plane configuration of a semiconductor device IGBT4 according to a fourth embodiment of the present invention taken along the plane A-A' in FIGS. 15 and 16.

FIG. 15 is a sectional view taken along the plane D-D' in FIG. 14.

FIG. 16 is a sectional view taken along the plane E-E' in FIG. 14.

The sectional views taken along the planes B-B' and C-C' in FIG. 14 are the same as those of the FIGS. 2 and 3 respectively.

In the IGBT4 according to the fourth embodiment, as shown in the plane configuration in FIG. 14, a trench 400 is formed in a loop shape. The purpose of this configuration is to achieve a high rated current and to lower an on-voltage.

The structure of the IGBT4 is equivalent to a structure obtained by connecting both ends of two adjacent trenches 103 in the plane configuration of the IGBT1 according to the first embodiment shown in FIG. 1. The IGBT4 therefore can make the n+ source 102 longer, which is facing to the gate electrode 106 holding the gate insulating layer 105 in between, than the IGBT1 of the first embodiment.

Saturation current is proportional to the total length of a length WS of the n+ source 102 shown in FIG. 14. The IGBT4 according to the fourth embodiment therefore can make the saturation current higher than that of the IGBT1 of the first embodiment which has been designed with the same structure except the arrangement of the trench.

Accordingly, a high rated current can be achieved since the upper current limit of the IGBT4 is increased. Further, on-voltage can also be lowered since electronic injection from the channels is increased.

In FIGS. 14 to 16, a difference between FIGS. 1 to 4 and 9 to 13 is the structure of the trench 400. Components shown with other symbols have the same structures, effects and functions as those shown in FIGS. 1 to 4 and 9 to 13 with the same symbols, and therefore the explanation will be omitted.

<<Configuration of Semiconductor Device IGBT4B as a First Modified Example According to the Fourth Embodiment>>

Figure 17:
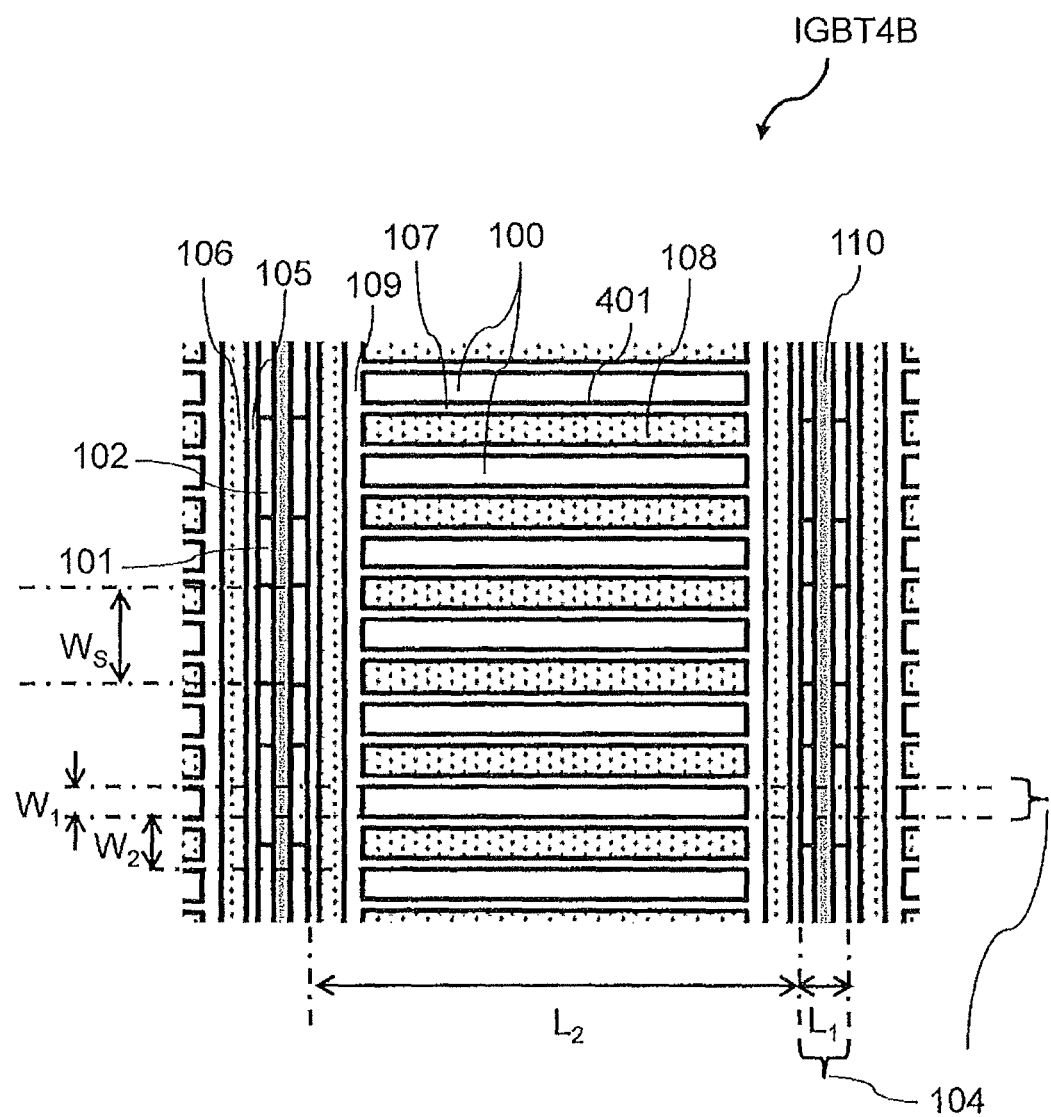
FIG. 17 is a sectional view, taken along a plane corresponding to plane A-A' in FIG. 2, of a semiconductor device IGBT4B according to a first modification of the fourth embodiment of the present invention to illustrate a horizontal arrangement in a horizontal planar view.

FIG. 17 is a diagram illustrating a plane configuration of a semiconductor device IGBT4B as a modified example 1 according to the fourth embodiment.

In FIG. 17, the IGBT4B has a structure in which a plurality of trenches 401 are arranged in a ladder structure. The structure of the trench 401 is equivalent to a structure obtained by coupling a plurality of the loop-shaped trenches 401.

In FIG. 17, a difference between FIGS. 1 to 4 and 9 to 16 is the structure of the trench 401. Components shown with other symbols have the same structures, effects and functions as those shown in FIGS. 1 to 4 and 9 to 16 with the same symbols, and therefore the explanation will be omitted.

<<Configuration of Semiconductor Device IGBT4C as a Second Modified Example According to the Fourth Embodiment>>

Figure 18:
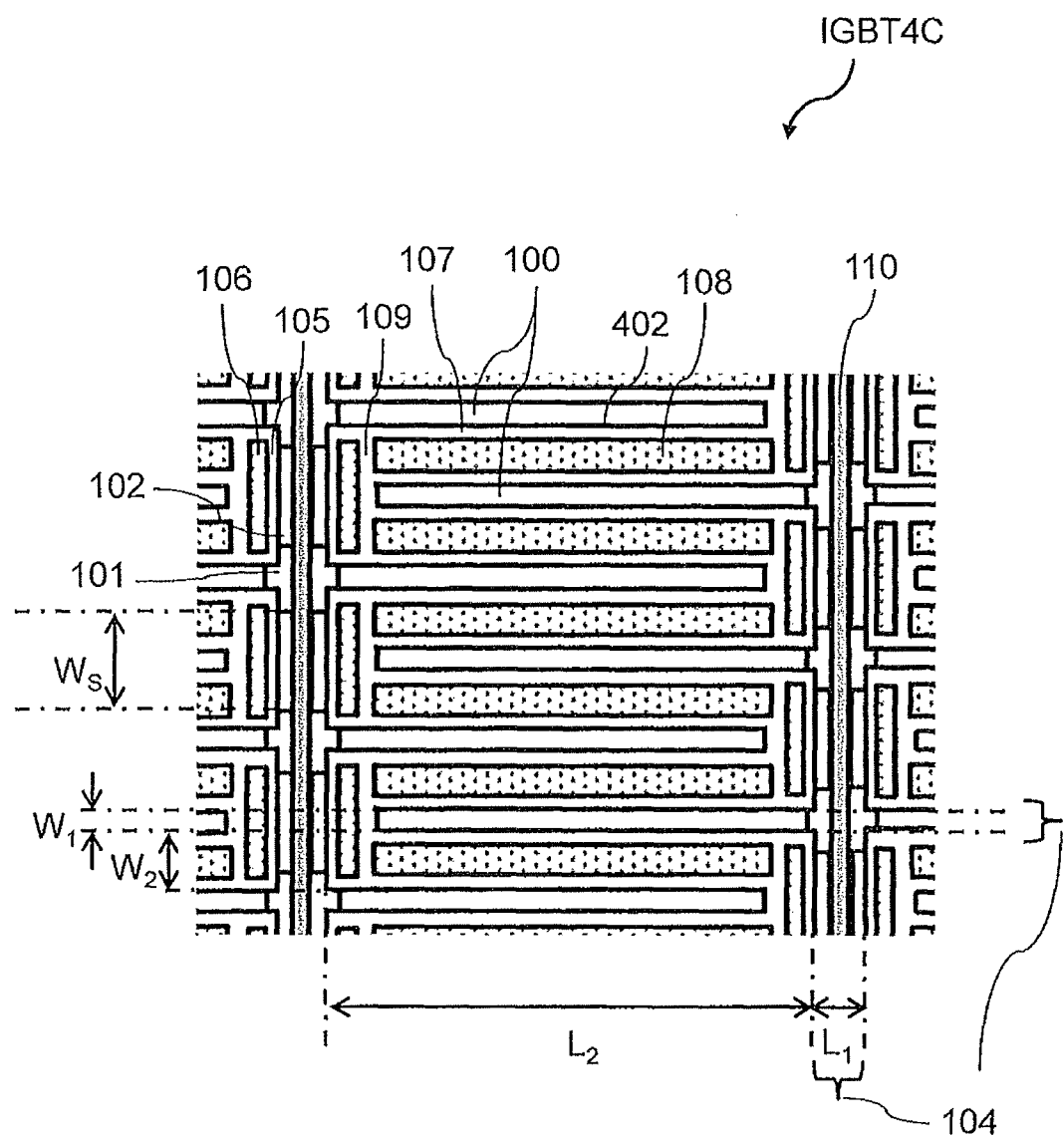
FIG. 18 is a sectional view, taken along a plane corresponding to plane A-A' in FIG. 2, of a semiconductor device IGBT4B according to a second modification of the fourth embodiment of the present invention to illustrate a horizontal arrangement in a horizontal planar view.

FIG. 18 is a diagram illustrating a plane configuration of a semiconductor device IGBT4C as a modified example 2 according to the fourth embodiment. The IGBT4 shown in FIG. 18 has a structure in which the trench 402 is arranged to have zigzag trench shape.

In FIG. 18, a difference between FIGS. 1 to 4 and 9 to 17 is the structure of the trench 402. Components shown with other symbols have the same structures, effects and functions as those shown in FIGS. 1 to 4 and 9 to 17 with the same symbols, and therefore the explanation will be omitted.

Fifth Embodiment

Electric Power Conversion System

Figure 28:
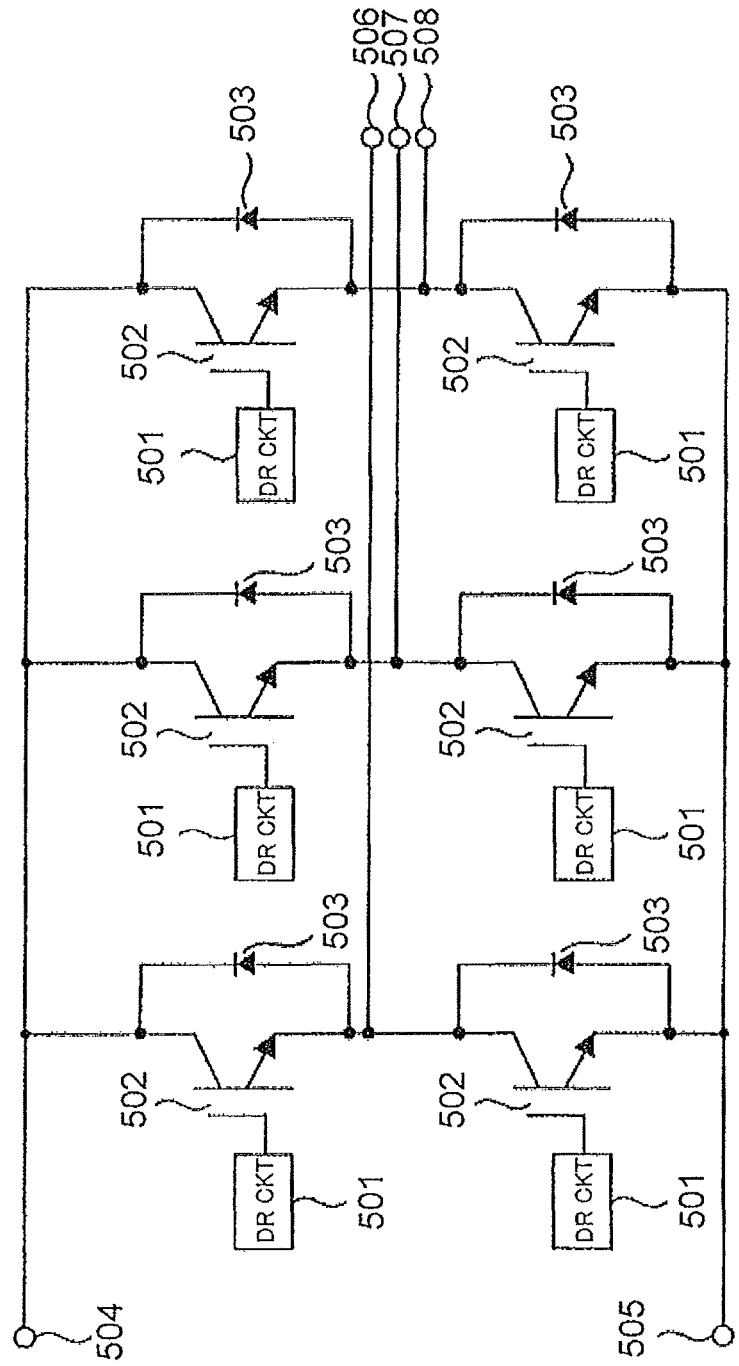
FIG. 28 is a circuit diagram showing a structure of an electric power conversion system according to a fifth embodiment of the present invention.

FIG. 28 is a circuit diagram showing a structure of an electric power conversion system according to a fifth embodiment of the present invention. This electric power conversion system adopts the IGBT explained in the aforementioned embodiments.

In FIG. 28, two IGBTs 502 are connected in series, and then connected between input terminals 504 and 505 which supply DC power.

The electric power conversion system includes three pairs of the serial-connected IGBTs 502. Output lines are lead from connecting points of the IGBTs 502 in the aforementioned three pairs. Each of the output lines is then connected to output terminals 506, 507 and 508.

Each of gate electrodes of the six IGBTs 502 in the three pairs is connected to the gate drive circuit 501. In addition, each of the six IGBTs 502 is connected to a tidal diode 503.

By the six IGBTs 502 including the six gate drive circuits 501 for pulse-width control, the DC power between the input terminals 504 and 505 is converted to 3-phase AC power having variable voltage and variable frequency, and outputted to the output terminals 506, 507 and 508.

Accordingly, the circuit in FIG. 28 forms an inverter circuit converting the DC power to 3-phase AC power having variable voltage and variable frequency, i.e. forms an electric power conversion system.

For implementing the IGBTs 502 in FIG. 28, IGBTs according to the embodiments 1 to 4 are applied. Herewith, low loss and high reliability of the power conversion system can be achieved.

Thus, explanations about the inverter circuit are described with respect to the electric power conversion system according to the fifth embodiment in FIG. 28. However, IGBTs according to the embodiments 1 to 4 may also be applied to a converter, a chopper or other electric power conversion systems, and the same effects can be obtained.

Other Embodiments

The embodiments according to the present invention have been explained above. However, the embodiments of the present invention are not limited to those explanations, and those skilled in the art ascertain the essential characteristics of the present invention and can make the various modifications and variations to the present invention to adapt it to various usages and conditions without departing from the spirit and scope of the claims.

In the first embodiment for example, sizes of the elements are mere examples and not limited thereto.

Further, in the embodiments above, the first conductivity type is defined as n-type and the second conductivity type is defined as p-type. The present invention is also effective when the first conductivity type is defined as p-type and the second conductivity type is defined as n-type.

Still further, in the embodiments above, polysilicon is used for the material of the gate electrode and the field plate. However, other conducting material may be used as well.

In addition, the present invention may be applied not only to IGBTs but also to other semiconductor devices having a trench gate structure.

Further, a part of a structure of one of the embodiments may be replaced with a structure of another one of the embodiments. In addition, a structure of one of the embodiments may be added to a structure of another embodiment.

With respect to a part of a structure of each embodiment, addition and replacement of another structure can be made. Note that only electrical wirings necessary for an explanation are shown but not all of the wirings are shown.

(IGBT as a Comparative Example (3))

The following is a supplemental comment to (IGBT as a comparative example (2)).

FIG. 19 is a perspective view of a cross-section showing a structure of a semiconductor device IGBT11 as a comparative example 1.

In FIG. 19, a floating p-layer 180 is provided.

In this case, when the IGBT is turned on, hole current flows into the floating p-layer 180 transiently and the electrical potential of the floating p-layer 180 rises. At this moment, the gate potential rises because displacement current flows to the gate electrode 106 via the parasitic capacitance of the gate insulating layer 105. The dIc/dt of the collector current is increase by the rise of the gate potential, and then the switching speed of the IGBT and the free-wheeling diodes are accelerated. The amount of electron holes flowing into the floating p-layer 180 transiently is determined mainly by the internal structure of a semiconductor, and it is difficult to control by external gate resistance. As a result, as shown in FIG. 20 above, there occurs a time period where the dV/dt of the IGBT output voltage and the dV/dt of the diodes of the pair of arms cannot be controlled by the gate resistance.

FIGS. 22 to 25 are a diagram showing a plane configuration of a semiconductor device IGBT12 as a comparative example 2. This configuration and problems are as described above (IGBT as a comparative example (1)).

Figure 27:
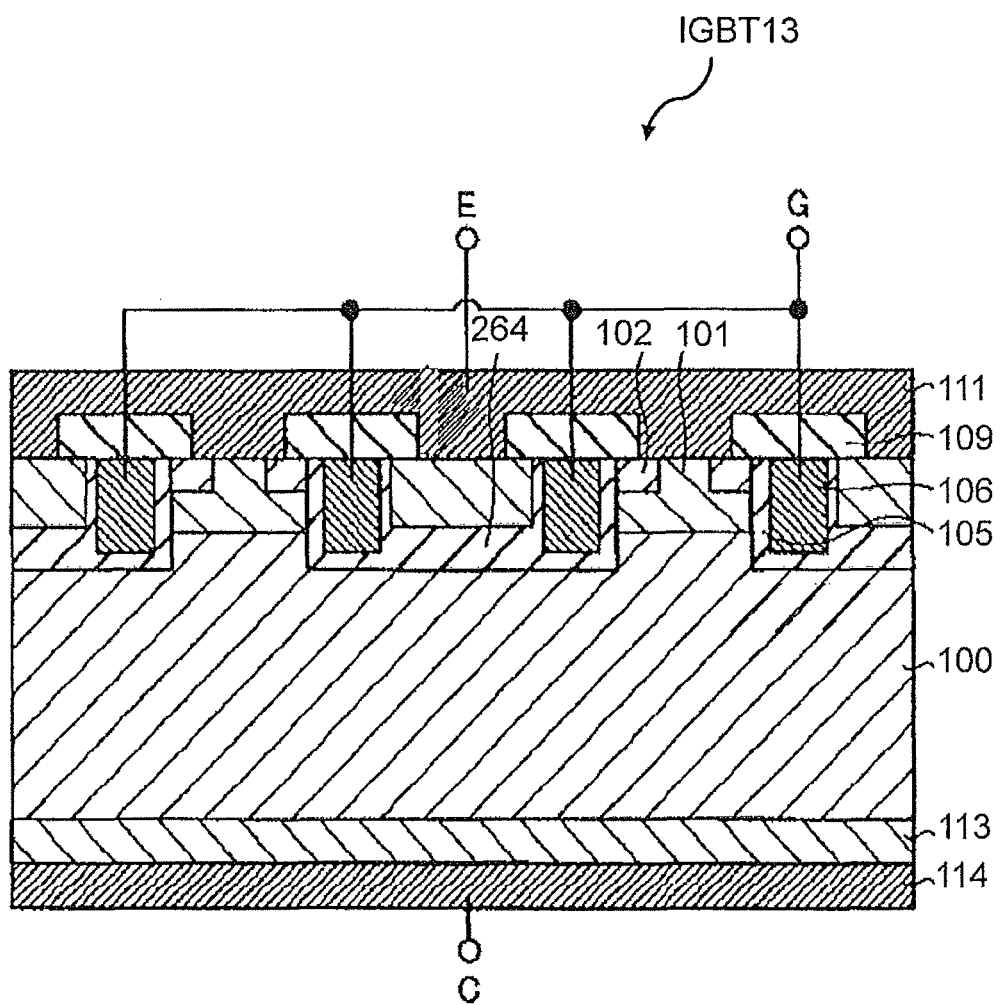
FIG. 27 is a sectional view showing a structure of a semiconductor device IGBT13 of a third comparative example.

FIG. 27 is a sectional view showing a structure of a semiconductor device IGBT13 as a comparative example 3.

In FIG. 27, an insulating region 264 is provided. This insulating region is formed using a semiconductor substrate on which a thick insulating film is embedded in advance. Further, a process is performed until epitaxial growth covers the surface of the insulating region 264.

In this case, there is a problem that a crystal defect may be generated due to the epitaxial growth covering the insulating film, and the crystal defect may cause high leakage current. Further, since additional process for forming the semiconductor substrate on which a thick insulating film is embedded is necessary, the cost of substrate may be increased.

In the first embodiment, as shown in FIGS. 1 and 2, there is provided a semiconductor device) IGBT1, comprising:

a first semiconductor layer 100 of a first conductivity type;

a second semiconductor layer 113 of a second conductivity type formed on one of surfaces of the first semiconductor layer;

trenches 104 formed in another surface of the first semiconductor layer opposite to the second semiconductor layer;

a semiconductor protruding part 104 on another surface of the first semiconductor layer between the trenches 103, comprising:

a part of the first semiconductor layer 100 arranged in a lateral direction (along line C-C' in FIG. 1) of the trenches 103 at a top surface;

a third semiconductor layer 101 of the second conductivity type formed on a surface of the first semiconductor layer 100 between the trenches 103 at a predetermined location at locations 102b and omitted at locations 102a (recurrently occur in the lateral direction); and a fourth semiconductor layer 102 of the first conductivity type partially formed on a surface of the third semiconductor layer at the predetermined locations 102a, having a higher impurity concentration than the first semiconductor layer 100;

a gate insulating layer 105 disposed on a part of an inner wall of each of the trenches 103;

a first interlayer insulating layer 107 disposed on a part of the inner wall of each of the trenches 103 other than a part of the inner wall on which the gate insulating layer 105 is disposed;

a first conductive layer 106, at least a part thereof facing the fourth semiconductor layer via the gate insulating layer 105;

a second conductive layer 108 formed on a surface of the first interlayer insulating layer 107;

a second interlayer insulating layer 109, at least a part thereof covering at least a part of a surface of the second conductive layer 106;

a third conductive layer 111, at least a part thereof being formed on surfaces of the third semiconductor layer 101 and the fourth semiconductor layer 102 and electrically connected to the fourth semiconductor layer 102;

a contacting part 110 electrically connecting the third conductive layer 111 and the third semiconductor layer 101; and a fourth conductive layer 114 formed on a surface of the second semiconductor layer; wherein a part of the surface of the semiconductor protruding part 104 includes a surface of the part of the first semiconductor layer 100.

In the second embodiment, as shown in FIG. 7, there is a difference from the first embodiment in that the first conductive layer is modified.

The first conductive layer 200 covers at least a part of the second interlayer insulation layer 109. The third conductive layer 111 covers at least apart of the third interlayer insulation layer 201. A part of the surface of the semiconductor protruding part 104 includes a surface of the part of the first semiconductor layer 100.

The invention claimed is:

1. A semiconductor device comprising:
a first semiconductor layer of a first conductivity type;
a second semiconductor layer of a second conductivity type formed on one of surfaces of the first semiconductor layer;
trenches formed on the other surface of the first semiconductor layer opposite to the second semiconductor layer;
a semiconductor protruding part whose side surfaces are sandwiched between the trenches and formed on a rest of the surface of the first semiconductor layer other than the surface on which the trenches are formed;
a third semiconductor layer of the second conductivity type formed on a surface of the semiconductor protruding part at a predetermined location;
a fourth semiconductor layer of the first conductivity type partially formed on a surface of the third semiconductor layer and having a higher impurity concentration than the first semiconductor layer;
a gate insulating layer disposed on a part of an inner wall of the trenches;
a first interlayer insulating layer disposed on a rest of the inner wall of the trenches other than the inner wall on which the gate insulating layer is disposed;
a first conductive layer, at least a part thereof facing the fourth semiconductor layer via the gate insulating layer;
a second conductive layer formed on a surface of the first interlayer insulating layer;
a second interlayer insulating layer, at least a part thereof covering at least a part of a surface of the second conductive layer;
a third conductive layer, at least a part thereof being formed on surfaces of the third semiconductor layer and the fourth semiconductor layer and electrically connected to the fourth semiconductor layer;
a contacting part electrically connecting the third conductive layer and the third semiconductor layer;
a fourth conductive layer formed on a surface of the second semiconductor layer,
wherein a part of the surface of the semiconductor protruding part includes a part of the first semiconductor layer; and
wherein the third semiconductor layer covers a circumference of side-wall of the first conductive layer.

2. The semiconductor device according to claim 1, wherein the contacting part covers a side-wall of the first conductive layer.

3. A semiconductor device comprising:
a first semiconductor layer of a first conductivity type;
a second semiconductor layer of a second conductivity type formed on one of surfaces of the first semiconductor layer;
trenches formed on the other surface of the first semiconductor layer opposite to the second semiconductor layer;
a semiconductor protruding part whose side surfaces are sandwiched between the trenches and formed on a rest of the surface of the first semiconductor layer other than the surface on which the trenches are formed;
a third semiconductor layer of the second conductivity type selectively formed on a surface of the semiconductor protruding part at a predetermined location;
a fourth semiconductor layer of the first conductivity type partially formed on a surface of the third semiconductor layer and having a higher impurity concentration than the first semiconductor layer;
a gate insulating layer disposed along a part of an inner wall of the trenches;
a first interlayer insulating layer disposed along a rest of the inner wall of the trenches other than the inner wall on which the gate insulating layer is disposed;
a first conductive layer at least a part thereof facing to the fourth semiconductor layer via the gate insulating layer;
a second conductive layer formed on a surface of the first interlayer insulating layer;
a second interlayer insulating layer at least a part thereof covering at least a part of a surface of the second conductive layer;
a third interlayer insulating layer at least a part thereof covering at least a part of the surface of the first conductive layer;
a third conductive layer at least a part thereof formed on surfaces of the third semiconductor layer and the fourth semiconductor layer;
a contacting part electrically connecting the third conductive layer and the third semiconductor layer;
a fourth conductive layer formed on a surface of the second semiconductor layer,
wherein at least a part of the first conductive layer covers at least a part of the second interlayer insulating layer,
at least a part of the third conductive layer covers at least a part of the third interlayer insulating layer,
a part of the surface of the semiconductor protruding part includes a part of the first semiconductor layer; and
wherein the third semiconductor layer covers a circumference of side-wall of the first conductive layer.

4. The semiconductor device according to claim 3, wherein the contacting part covers a side-wall of the first conductive layer.

5. A semiconductor device comprising:

a first semiconductor layer of a first conductivity type;

a second semiconductor layer of a second conductivity type formed on one of surfaces of the first semiconductor layer;

trenches formed on the other surface of the first semiconductor layer opposite to the second semiconductor layer;

a semiconductor protruding part whose side surfaces sandwiched between the trenches and formed on a rest of the surface of the first semiconductor layer other than the surface on which the trenches are formed;

a third semiconductor layer of the second conductivity type formed on a surface of the semiconductor protruding part at a predetermined location;

a fourth semiconductor layer of the first conductivity type partially formed on a surface of the third semiconductor layer and having a higher impurity concentration than the first semiconductor layer;

a gate insulating layer disposed on a part of an inner wall of the trenches;

a first interlayer insulating layer disposed on a rest of the inner wall of the trenches other than the inner wall on which the gate insulating layer is disposed;

a first conductive layer, at least a part thereof facing the fourth semiconductor layer via the gate insulating layer;

a second conductive layer formed on a surface of the first interlayer insulating layer;

a second interlayer insulating layer, at least a part thereof covering at least a part of a surface of the second conductive layer;

a third conductive layer, at least a part thereof being formed on surfaces of the third semiconductor layer and the fourth semiconductor layer and electrically connected to the fourth semiconductor layer;

a contacting part electrically connecting the third conductive layer and the third semiconductor layer;

a fourth conductive layer formed on a surface of the second semiconductor layer, wherein a part of the surface of the semiconductor protruding part includes a part of the first semiconductor layer; and wherein the adjacent trenches are connected together to communicate each other to have a loop trench shape in a horizontal planar view.

6. The semiconductor device according to claim 5, wherein the adjacent trenches having the loop trench shape are connected in a ladder shape in a horizontal planar view.

7. A semiconductor device comprising:

a first semiconductor layer of a first conductivity type;

a second semiconductor layer of a second conductivity type formed on one of surfaces of the first semiconductor layer;

trenches formed on the other surface of the first semiconductor layer opposite to the second semiconductor layer;

a semiconductor protruding part whose side surfaces sandwiched between the trenches and formed on a rest of the surface of the first semiconductor layer other than the surface on which the trenches are formed;

a third semiconductor layer of the second conductivity type selectively formed on a surface of the semiconductor protruding part at a predetermined location;

a fourth semiconductor layer of the first conductivity type partially formed on a surface of the third semiconductor layer and having a higher impurity concentration than the first semiconductor layer;

a gate insulating layer disposed along a part of an inner wall of the trenches;

a first interlayer insulating layer disposed along a rest of the inner wall of the trenches other than the inner wall on which the gate insulating layer is disposed;

a first conductive layer at least a part thereof facing to the fourth semiconductor layer via the gate insulating layer;

a second conductive layer formed on a surface of the first interlayer insulating layer;

a second interlayer insulating layer at least a part thereof covering at least a part of a surface of the second conductive layer;

a third interlayer insulating layer at least a part thereof covering at least a part of the surface of the first conductive layer;

a third conductive layer at least a part thereof formed on surfaces of the third semiconductor layer and the fourth semiconductor layer;

a contacting part electrically connecting the third conductive layer and the third semiconductor layer;

a fourth conductive layer formed on a surface of the second semiconductor layer, wherein at least a part of the first conductive layer covers at least a part of the second interlayer insulating layer, at least a part of the third conductive layer covers at least a part of the third interlayer insulating layer, a part of the surface of the semiconductor protruding part includes a part of the first semiconductor layer; and wherein the adjacent trenches are connected together to communicate each other to have a loop trench shape in a horizontal planar view.

8. The semiconductor device according to claim 7, wherein the adjacent trenches having the loop trench shape are connected in a ladder shape in a horizontal planar view.

9. A semiconductor device comprising:

a first semiconductor layer of a first conductivity type;

a second semiconductor layer of a second conductivity type formed on one of surfaces of the first semiconductor layer;

trenches formed on the other surface of the first semiconductor layer opposite to the second semiconductor layer;

a semiconductor protruding part whose side surfaces sandwiched between the trenches and formed on a rest of the surface of the first semiconductor layer other than the surface on which the trenches are formed;

a third semiconductor layer of the second conductivity type formed on a surface of the semiconductor protruding part at a predetermined location;

a fourth semiconductor layer of the first conductivity type partially formed on a surface of the third semiconductor layer and having a higher impurity concentration than the first semiconductor layer;

a gate insulating layer disposed on a part of an inner wall of the trenches;

a first interlayer insulating layer disposed on a rest of the inner wall of the trenches other than the inner wall on which the gate insulating layer is disposed;

a first conductive layer, at least a part thereof facing the fourth semiconductor layer via the gate insulating layer;

a second conductive layer formed on a surface of the first interlayer insulating layer;

a second interlayer insulating layer, at least a part thereof covering at least a part of a surface of the second conductive layer;

a third conductive layer, at least a part thereof being formed on surfaces of the third semiconductor layer and the fourth semiconductor layer and electrically connected to the fourth semiconductor layer;

a contacting part electrically connecting the third conductive layer and the third semiconductor layer;

a fourth conductive layer formed on a surface of the second semiconductor layer, wherein a part of the surface of the semiconductor protruding part includes a part of the first semiconductor layer; and wherein the adjacent trenches having the loop trench shape are connected to have a zigzag trench in the horizontal planar view.

10. A semiconductor device comprising:

a first semiconductor layer of a first conductivity type;

a second semiconductor layer of a second conductivity type formed on one of surfaces of the first semiconductor layer;

trenches formed on the other surface of the first semiconductor layer opposite to the second semiconductor layer;

a semiconductor protruding part whose side surfaces sandwiched between the trenches and formed on a rest of the surface of the first semiconductor layer other than the surface on which the trenches are formed;

a third semiconductor layer of the second conductivity type selectively formed on a surface of the semiconductor protruding part at a predetermined location;

a fourth semiconductor layer of the first conductivity type partially formed on a surface of the third semiconductor layer and having a higher impurity concentration than the first semiconductor layer;

a gate insulating layer disposed along a part of an inner wall of the trenches;

a first interlayer insulating layer disposed along a rest of the inner wall of the trenches other than the inner wall on which the gate insulating layer is disposed;

a first conductive layer at least a part thereof facing to the fourth semiconductor layer via the gate insulating layer;

a second conductive layer formed on a surface of the first interlayer insulating layer;

a second interlayer insulating layer at least a part thereof covering at least a part of a surface of the second conductive layer;

a third interlayer insulating layer at least a part thereof covering at least a part of the surface of the first conductive layer;

a third conductive layer at least a part thereof formed on surfaces of the third semiconductor layer and the fourth semiconductor layer;

a contacting part electrically connecting the third conductive layer and the third semiconductor layer;

a fourth conductive layer formed on a surface of the second semiconductor layer, wherein at least a part of the first conductive layer covers at least a part of the second interlayer insulating layer, at least a part of the third conductive layer covers at least a part of the third interlayer insulating layer, a part of the surface of the semiconductor protruding part includes a part of the first semiconductor layer; and wherein the adjacent trenches having the loop trench shape are connected to have a zigzag trench in the horizontal planar view.

* * * * *